United States Patent [19]
Nishizawa et al.

[11] Patent Number: 5,693,139
[45] Date of Patent: Dec. 2, 1997

[54] GROWTH OF DOPED SEMICONDUCTOR MONOLAYERS

[75] Inventors: Junichi Nishizawa; Hitoshi Abe, both of Miyai-ken; Soubei Suzuki, 1-3, Otamayahshita, Sendai-shi, Miyagi-ken, all of Japan

[73] Assignees: Research Development Corporation of Japan, Tokyo; Jun-Ichi Nishizawa, Sendai; Oki Electric Company, Tokyo; Soubei Suzuki, Sendai, all of Japan

[21] Appl. No.: 77,119

[22] Filed: Jun. 15, 1993

Related U.S. Application Data

[63] Continuation-in-part of Ser. No. 671,995, Mar. 18, 1991, abandoned, and Ser. No. 482,283, Feb. 20, 1990, abandoned, which is a continuation of Ser. No. 234,002, Aug. 12, 1988, abandoned, which is a continuation of Ser. No. 759,087, Jul. 25, 1985, abandoned, said Ser. No. 671,995, is a continuation of Ser. No. 372,156, Jun. 27, 1989, abandoned, which is a continuation of Ser. No. 122,997, Nov. 19, 1987, abandoned.

[30] Foreign Application Priority Data

| Jul. 26, 1984 | [JP] | Japan | 59-153977 |
| Jul. 26, 1984 | [JP] | Japan | 59-153980 |
| Jul. 25, 1985 | [GB] | United Kingdom | 8518834 |
| Jul. 26, 1985 | [DE] | Germany | 3526824 |
| Jul. 26, 1985 | [FR] | France | 85 11517 |
| Nov. 20, 1986 | [JP] | Japan | 61-275425 |
| Nov. 20, 1987 | [DE] | Germany | 3739450 |
| Nov. 20, 1987 | [FR] | France | 87 16124 |
| Nov. 20, 1987 | [GB] | United Kingdom | 8727277 |

[51] Int. Cl.$^6$ .................................................. C30B 25/14
[52] U.S. Cl. ..................... 117/89; 117/93; 117/102; 117/105; 117/953; 117/954; 117/956; 437/102; 437/103
[58] Field of Search .......................... 437/102, 103; 427/243, 255.1; 117/953, 954, 956, 89, 93, 102, 105

[56] References Cited

PUBLICATIONS

Tohru Kurabayashi et al., "Photoexcited Molecular Layer Epitaxial Growth Process of GaAs, GaAs and Si, and Photo–Vapor–Epitaxy of GaAs", Collected Summaries of Researches (published for Research Development Corporation of Japan), Dec. 19, 1986, cover pages and pp. 1–24 all in Japanese (An English translation of the pertinent pp. 13–14 is attached.).

Junichi Nishizawa et al., "Molecular Layer Epitaxy", Semiconductor Research, vol. 29 (published for Industrial Survey under the Foundation for Promoting Semiconductor Research), Aug. 22, 1987, cover page and p. 97–136 all in Japanese (An English translation of the pertinent pp. 98 to 103 is attached.).

(List continued on next page.)

*Primary Examiner*—Robert Kunemund
*Attorney, Agent, or Firm*—Armstrong, Westerman, Hattori, McLeland, & Naughton

[57] ABSTRACT

A cycle of alternately or cyclically introducing external gases containing molecules of component elements of a compound semiconductor to be formed on a substrate is repeated while appropriately controlling the pressure, substrate temperature and gas introduction rate in a crystal growth vessel, so that a monocrystal which is dimensionally as precise as a single monolayer can grow on the substrate by making use of chemical reactions on the heated substrate surface.

Doped molecular layer epitaxy of a compound semiconductor comprising individual steps of introducing and evacuating a first source gas, introducing and evacuating a second source gas, and introducing and evacuating an impurity gas which contains an impurity element. The doped impurity concentration varies almost linearly with the pressure during doping in a wide range.

32 Claims, 16 Drawing Sheets

PUBLICATIONS

Tohru Kurabayashi, "Photo–Assisted Molecular Layer Epitaxy", Semiconductor Research, vol. 33 (published for Industrial Survey under the Foundation for Promoting Semiconductor Research, Aug. 8, 1989, cover page and 33 pags all in Japanese (An English translation of the pertinent pp. 4–6 is attached.).

Junichi Nishizawa, "Crystal Growth by Atomic Layer Epitaxy" Applied Physics, vol. 53, No. 6 (1984), (An English translation of the pertinent pp. 516–519 is attached.).

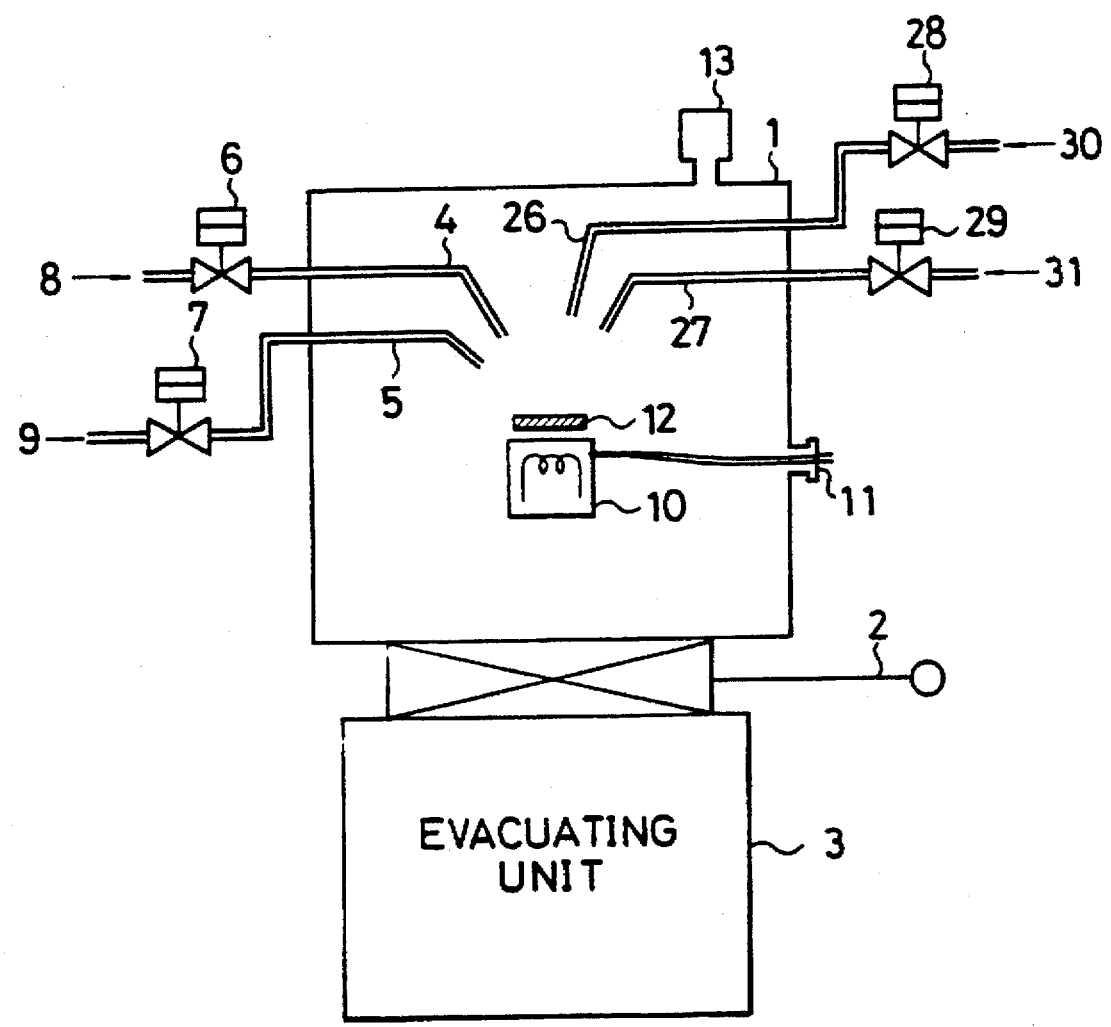

GROWTH OF DOPED SEMICONDUCTOR MONOLAYERS

CROSS-REFERENCE TO COPENDING APPLICATIONS

This is a continuation-in-part of U.S. Ser. No. 07/671,995 filded Mar. 18, 1991, now abandoned, and which is in turn a continuation of U.S. Ser. No. 07/372,156 filded Jun. 27, 1989, now abandoned, and which is in turn a continuation of U.S. Ser. No. 07/122,997 filed Nov. 19, 1987, now abandoned, and this is also a continuation-in-part of U.S. Ser. No. 07/482,283 filed Feb. 20, 1990, now abandoned, and which is in turn a continuation of U.S. Ser. No. 07/234,002 filed Aug. 12, 1988, now abandoned, and which is in turn a continuation of U.S. Ser. No. 06/759,087 filed Jul. 25, 1985, now abandoned.

BACKGROUND OF THE INVENTION

1. Field of the Invention

This invention relates to growth of doped single crystal semiconductor films and more particularly to growth of doped compound semiconductor monolayers. In this specification, the term "monolayer" will mean monomolecular layer.

2. Description of the Related Art

A Metal Organic Vapor Phase epitaxy process (hereinafter referred to as an MO-CVD process), a molecular beam epitaxial process (hereinafter referred to as an MBE process) and an atomic layer epitaxial process (hereinafter referred to as an ALE process) are well known in the art as vapor phase epitaxial techniques for obtaining crystalline thin film of semiconductors.

In the MO-CVD process, III and V group elements as sources, and hydrogen gas or the like as a carrier are simultaneously introduced into a reaction chamber to cause crystal growth by means of thermal decomposition. Thermal decomposition results in a poor quality of the grown crystal layer. In addition, thickness control which is dimensionally as precise as a single monolayer is difficult.

The MBE process is well known as a crystal growth process making use of a ultrahigh vacuum. This process, however, includes a first stage of physical adsorption. Therefore, the quality of the crystal obtained is inferior to that obtained by the CVD process which makes use of a chemical reaction. Besides, for the growth of a compound semiconductor such as GaAs of III and V group elements, III and V group elements are used as sources and are disposed in a growth chamber. Therefore, it is difficult to control the amount and rate of vaporization of gases evaporated as a result of the heating of the sources.

In addition, replenishment of the sources and maintenance of a constant growth rate for a long period of time are difficult. Furthermore, the construction of the evacuating device is complicated and precise control of the stoichiometric composition of a compound semiconductor is difficult. Consequently, the MBE process is deficient in that high quality crystals cannot be obtained.

The ALE process is an improvement over the MBE process. In this process, component elements of a compound semiconductor are alternately supplied in the form of pulses so that monatomic layers are alternately deposited on a substrate to cause growth of a thin film composed of atomic layers, as disclosed in U.S. Pat. No. 4,058,430 (1977) to T. Suntola et al. Although this process is advantageous in that the film thickness can be controlled with the precision of the atomic layer, it is actually an extension of the MBE process, and the crystal quality is not satisfactory as in the case of the MBE process. Besides, its application is limited to growth of thin films of compound semiconductors, e.g., those of II and IV group elements, such as CdTe and ZnTe, and the process is not successfully applicable to Si or GaAs, which is the most important semiconductor material presently used for the production of semiconductor devices including ultra LSI's. There are attempts for improving the ALE process so as to absorb molecules to the surface of a crystal thereby to make use of chemical reactions on the surface of the crystal. This approach, however, concerns only with the growth of polycrystals of ZnS or amorphous thin films of $Ta_2O_5$, and is not concerned with a single crystal growth technique.

Meanwhile, with the recent ever-increasing speed of communications and controls, there are strong demands for production of various three-terminal elements and diodes which can exhibit high performance in the range of microwaves and milliwaves and also for semiconductor devices operating in the light wave range (e.g., lasers, light-emitting and light-receiving elements, etc.). Accordingly, there has been a strong demand for a selective epitaxial process for growth of a crystal of three-dimensional structure which is dimensionally as precise as a single monolayer in the thicknesswise direction.

With the aforesaid MO-CVD process, MBE process and ALE process, however, it is difficult to obtain a selective epitaxial growth layer corresponding to a mask pattern on a substrate with the dimensional precision described above because the crystal grows on the mask material as well.

Since the desired selective epitaxial growth cannot be attained with all of the prior art processes described above, it is difficult to obtain high quality crystals having satisfactory stoichiometric compositions by the MO-CVD process and MBE process, while single crystals cannot also be obtained by the ALE process.

Organo-metal chemical vapor deposition (OMCVD or MOCVD), molecular beam epitaxy (MBE), etc. are known as the vapor phase epitaxial growth techniques for growing semiconductor single crystal thin films.

For example, in an example of MOCVD for growing group III-V compound semiconductor single crystal thin films, an organo-metal gas containing a group III element and a gas containing a group V element are simultaneously introduced into a reaction chamber with $H_2$ gas or the like serving as a carrier gas, thereby growing group III-V compound semiconductor single crystal thin films on a substrate crystal through chemical reaction. Since a large quantity of source gases co-exist in a reaction chamber, this method is fired for mass production. The thickness control of grown film at the monolayer order, however, is not easy.

According to MBE, a molecular beam is formed by evaporation or the like in an ultra-high vacuum and directed to a substrate crystal producing deposition of a single crystal film on the substrate crystal. The thickness control of the grown crystal at the monolayer order can be achieved in this method. The crystal growth by MBE, however, involves physical adsorption as the first step, which may lead to inferior crystallinity to that obtainable by CVD utilizing chemical reaction. In growing a group III-V compound semiconductor crystal, such as GaAs, a group III element and a group V element are used as sources or raw materials. Solid source materials may directly be set in a reaction chamber and heated to generate vapor phase sources. The control of evaporation and the feed of additional source materials, however, are not easy. Thus, it is rather difficult to keep the growth rate at a constant value for a long period. For exhausting the waste vapors to keep the ultra high vacuum, there are restrictions on the evacuation system. Also, it is not easy to precisely control the stoichiometric composition of the compound semiconductor. Thus, it is not easy to obtain crystals of high quality by MBE. Some of the present inventors have proposed a method of growing semiconductor crystals, which is named molecular layer epitaxy, and which has a film thickness controllability of the order of monolayers (Japanese Patent Application 59-153978 which is published as Laid-Open 61-34928, and corresponds to U.S. Pat. application Ser. No. 07/759,098, which is incorporated herein by reference).

For making various semiconductor devices such as bipolar transistors, field effect transistors, static induction transistors, etc., it is desired to grow epitaxial multilayer structures having sharp impurity concentration profiles of npn, npin, pnp, pnip, $n^+in$, $n^+n^-n^+$, etc. It is strongly desired to control the impurity concentration in n- and p-type grown layers arbitrarily. Also, the miniaturization of scaling-down of a transistor is desired to achieve high speed and low power dissipation operation and high integration density. As the scaling down proceeds, the width of the conducting members becomes small. For forming good electrodes or contacts, it is necessary to make the contact resistance small and the current density per unit area large. For such usages, semiconductor regions of very high impurity concentrations ($n^+$ or $p^+$) are desired.

According to the growth method proposed by some of the present inventors as referred before, the control of impurity concentration was not always good. For example, a non-doped (not intentionally doped) GaAs film might have a p type impurity concentration of $10^{18}$ to $10^{20}$ cm$^{-3}$. Improvement in control of impurity doping has been desired.

SUMMARY OF THE INVENTION

One aspect of the present invention is directed to a method of doping a compound semiconductor single crystal layer being grown in monolayers on a heated substrate in a growth chamber by alternate introduction of source gases, the growth chamber being evacuated continuously at a continuous rate of evacuation throughout the whole method. The method comprises the steps of:

(a) introducing a first source gas containing one constituent element of the compound into the growth chamber of at least a sufficient quantity for growing one monolayer, the supply of the first source gas being thereafter stopped and the growth chamber still being kept under the continuous rate of evacuation to evacuate residual of the first source gas;

(b) introducing a second source gas containing another constituent element of the compound into the growth chamber of at least a sufficient quantity for growing one monolayer, the supply of the second source gas being thereafter stopped and the growth chamber still being kept under the continuous rate of evacuation to evacuate residual of the second source gas;

(c) doping an impurity gas into the growth chamber, the impurity gas being of a particular type and having impurities which enter into sites in the monolayer being grown;

(d) initially carrying out steps (a), (b) and (c) to grow a monolayer on the substrate and then growing monolayers one over the other by cyclically repeating steps (a), (b) and (c) to grow a new monolayer on the monolayer just previously grown; and (e) selectively implementing an order in which steps (a), (b) and (c) take place during each cycle of step (d) based on the particular type of impurity gas being doped and selectively timing when step (c) takes place with respect to the timing of steps (a) and (b) based on obtaining a desired dopant type for the monolayer being grown and a desired level of impurity concentration in the monolayer being grown, whereby the continuous evacuation causes evacuation of residual waste of the first source gas, the second source gas, and the impurity gas.

Under these conditions, growth of a mono-crystalline thin film of a compound semiconductor of a desired thickness can grow with dimensional precision as precise as a single monolayer.

The present invention is also directed to a process for forming a single crystalline thin film of a III-V or a II-VI compound semiconductor comprising the steps of:

(a) continuously evacuating the interior of a crystal growth vessel at a constant rate of evacuation;

(b) heating a substrate disposed in the crystal growth vessel to a temperature of from about 300 to 800 degrees C.;

(c) introducing into the crystal growth vessel, under a first deposition pressure of from about $10^{-1}$ to $10^{-7}$ Pascal and for a first time period of from about 0.5 to 200 seconds, sufficient quantity of gaseous molecules of a first compound to form at least a single molecular layer of the first compound on the substrate, the first compound selected from the group consisting of group III and group II compounds respectively, which first compound contains a first constituent element of the III-V or II-VI compound semiconductor;

(d) further introducing into the crystal growth vessel, under a second deposition pressure of from about $10^{-1}$ to $10^{-7}$ Pascal and for a second time period of from about 0.5 to 200 seconds, sufficient quantity of gaseous molecules of a second compound to form at least a single molecular layer of the second compound on the substrate, the second compound selected from the group consisting of group V and group VI compounds respectively, which second compound contains a second constituent element of the II-V or II-VI compound semiconductor; the single-crystalline film being at least n times as thick as a single molecular layer of the compound semiconductor, where n is an integer of 1, 2 or larger to cause growth of a monocrystalline thin film of the compound semiconductor having dimensions as precise as a single molecular layer, the step (a) being continuous for evacuating any waste of the gaseous molecules introduced to form the first and second compound.

Still another aspect of the invention is directed to a method for forming a monocrystalline thin film of a compound semiconductor comprising the steps of:

(a) forming on a crystalline substrate a mask pattern of a material different from that of the substrate;

(b) rinsing and drying the substrate formed with the mask pattern;

(c) disposing the substrate formed with the mask pattern in a crystal growth vessel;

(d) evacuating the interior of the crystal growth vessel to an evacuation pressure of from about $10^{-7}$ to $10^{-8}$ Pascal;

(e) heating the substrate;

(f) introducing sufficient quantity of gaseous molecules containing a first constituent element of a compound semiconductor into the crystal growth vessel under a pressure from about $10^{-1}$ to $10^{-7}$ Pascal for a first period of time from about 0.5 to 200 seconds to form at least a single molecular layer of the first constituent element on the substrate;

(g) again evacuating the interior of the crystal growth vessel to the evacuation pressure;

(h) further introducing into the crystal growth vessel under a second deposition pressure of from about $10^{-1}$ to $10^{-7}$ Pascal and for a second time period of from about 0.5 to 200 seconds, sufficient quantity of gaseous molecules containing a second constituent element of the compound semiconductor to form at least a single molecular layer of the second constituent element on the substrate;

(i) again evacuating the interior of the crystal growth vessel to the evacuation pressure; and (j) repeating a sequence of the above steps to cause growth of single monolayers, the single crystalline film being at least n times as thick as a monolayer of the compound semiconductor, where n is an integer of 1, 2 or larger, wherein a single-crystalline thin film of the compound semiconductor having a desired thickness is selectively formed on the substrate with precision as precise as a single monolayer.

BRIEF DESCRIPTION OF THE DRAWINGS

For a better understanding of the present invention, reference is made to the following description and accompanying drawings, while the scope of the invention is set forth in the appended claims.

FIG. 7 illustrates how a superstructure is formed by the device shown in FIG. 6, wherein

FIGS. 8 and 9 are schematic views showing the construction of crystal growth devices preferably used for carrying out further embodiments of the invention, respectively.

DESCRIPTION OF THE PREFERRED EMBODIMENTS

Figure 1:
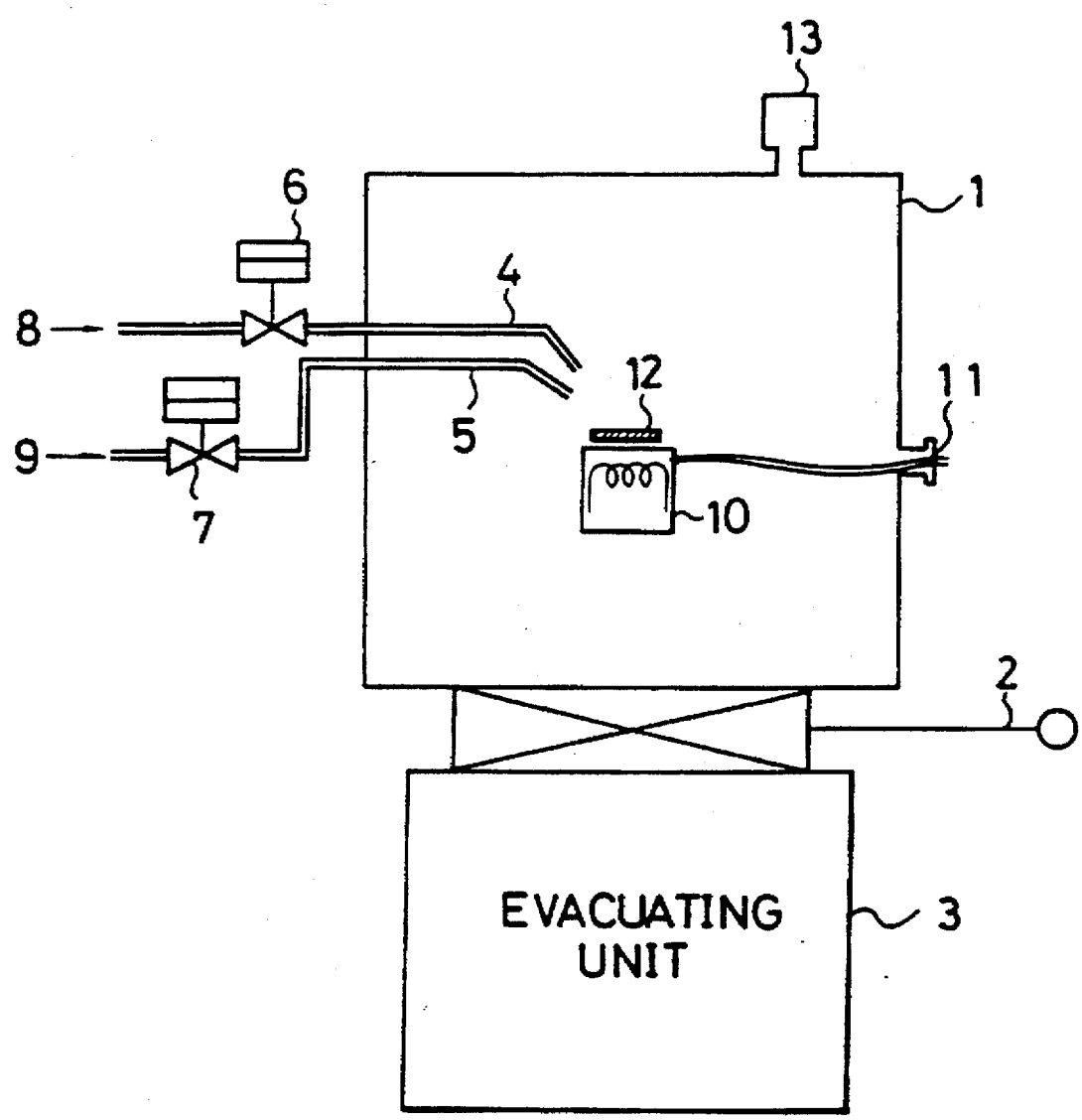
FIG. 1 is a schematic view showing the construction of a crystal growth device preferably used for carrying out an embodiment of the invention.

Referring now to FIG. 1, a crystal growth vessel 1 is made of stainless steel or like metal. The vessel 1 is coupled to an evacuating unit 3 via a gate valve 2 for evacuating its interior to a ultrahigh vacuum. The vessel 1 includes nozzles 4 and 5 introducing gaseous compounds containing III and V group elements respectively as components of a III-V group compound semiconductor which grows on a substrate 12. The nozzles 4 and 5 are provided with on-off valves 6 and 7 for controlling the introduced amounts of the gaseous compounds 8 and 9 containing the III and V group elements, respectively, by selectively opening and closing feed paths for the gaseous compounds being directed to nozzles 4 and 5. A heater 10 for heating the substrate 12 is disposed in the vessel 1, and a thermocouple 11 is coupled to the heater 10 for measuring the temperature thereof. The heater 10 includes a tungsten filament sealed in a quartz glass casing, on which the substrate 12 is mounted. The vessel 1 is further provided with a pressure gauge 13 for measuring the value of the vessel's internal vacuum.

A monocrystalline thin film of a compound semiconductor is formed in a manner as described below by the crystal growth device of the construction shown in FIG. 1. Suppose, for example, the case of epitaxial growth of a single crystal of GaAs on the substrate 12 of GaAs. First, the vessel 1 is evacuated to about $10^{-7}$ to $10^{-8}$ Pascal (hereinafter abbreviated as Pa) by opening the gate valve 2 and operating the ultrahigh-vacuum evacuating unit 3. Then, the GaAs substrate 12 is heated to 300° to 800° C. by the heater 10. Thereafter, gaseous trimethyl gallium (TMG) 8 is introduced as a gas containing Ga by keeping the valve 6 open for 0.5 to 10 seconds and maintaining the internal pressure of the vessel 1 to $10^{-1}$ to $10^{-7}$ Pa. Then, the valve 6 is closed, and the vessel 1 is evacuated again. Thereafter, gaseous arsine ($AsH_3$) 9 is introduced as a gas containing As by keeping the valve 7 open for 2 to 200 seconds and maintaining the internal pressure of the vessel 1 at $10^{-1}$ to $10^{-7}$ Pa. As a result, at least one molecular layer of GaAs grows on the substrate 12.

Thus, growth of a single crystal growth layer of GaAs having a desired thickness can be attained with precision as precise as a single monolayer by repeating the process of growth of the monomolecular layer in the manner described above.

Figure 2:
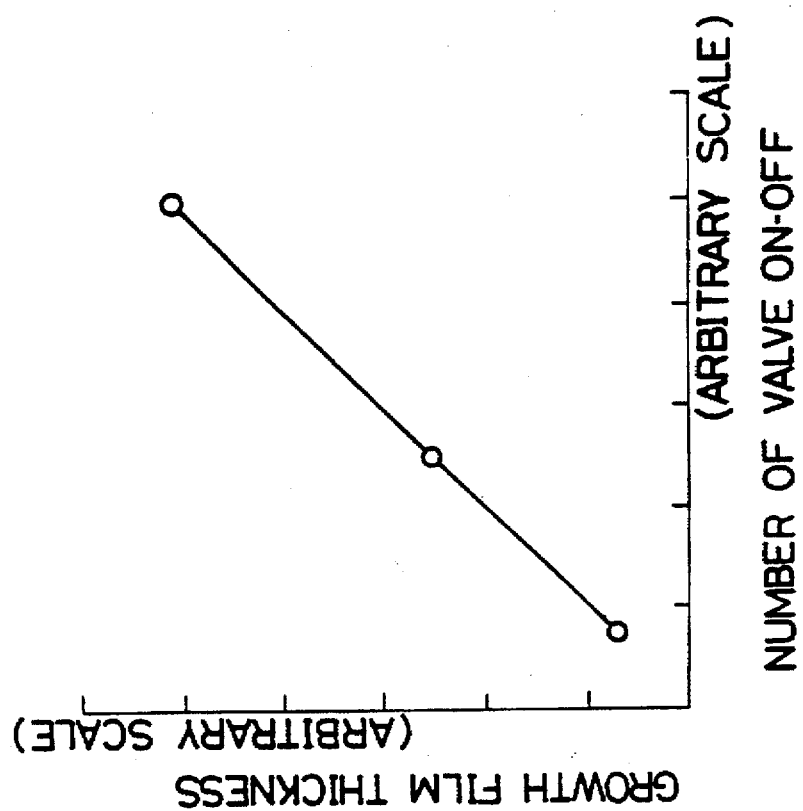
FIG. 2A is a graph showing the relation between the thickness of the film grown and the amount of TMG introduced per cycle of the process carried out by the device illustrated in FIG. 1.
FIG. 2B is a graph showing the relation between the thickness of the film grown and the number of valve on-off operations in the process carded out by the device illustrated in FIG. 1.
Figure 2:
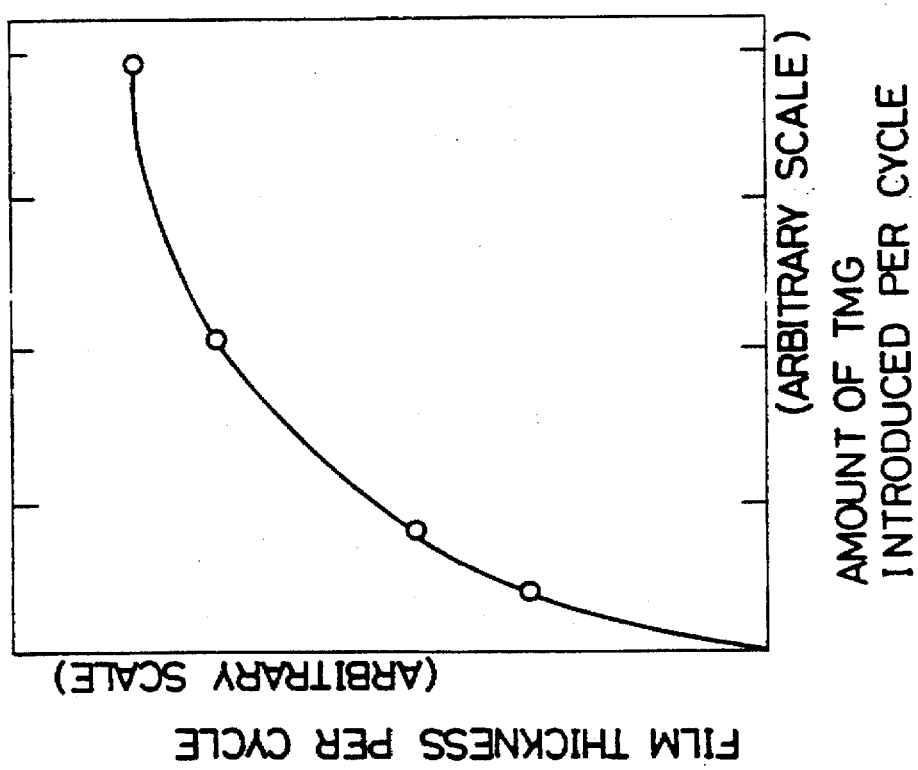

FIG. 2A shows the thickness of the GaAs film grown per cycle using TMG and $AsH_3$ as component-containing gases at a growth temperature of 500° C., the thickness being plotted relative to the amount of TMG introduced per cycle. It will be seen from this graph that, as the amount of TMG introduced per cycle is increased, the thickness of the film grown is ultimately saturated. This means that a single monolayer or a dimolecular layer can be reliably grown in one cycle even with slight fluctuations of the amounts of gases introduced so long as the amounts are in excess of those corresponding to the saturation thickness. FIG. 2B shows the thickness of the epitaxially grown GaAs layer plotted relative to the number of cycles of alternate introduction of TMG and $AsH_3$ to illustrate the condition of saturation. It will be apparent from the graph that a very satisfactory linearity is obtained, so that it is possible to accurately control the film thickness to any desired value. Examination of the GaAs epitaxial growth layer thus obtained by electron beam diffraction and X-ray diffraction reveals that the layer has a monocrystalline thin-film structure of very high perfectness.

The material gas containing Ga is not limited to TMG, and a thin film of GaAs having a satisfactory crystalline structure could also be obtained by introducing a gas such as TEG, ZEGaCl, DMGaCl, $GaCl_3$, $GaBr_3$, or $GaI_3$.

Figure 3:
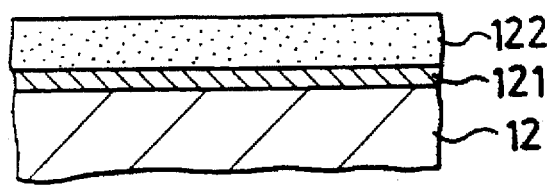
FIGS. 3A to 3E are schematic sectional views illustrating the selective growth process carried out by the device shown in FIG. 1.
Figure 3:
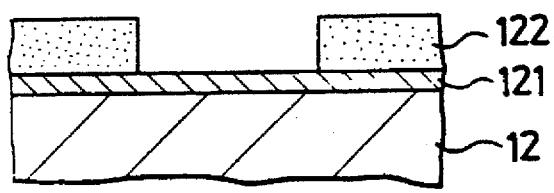
Figure 3:
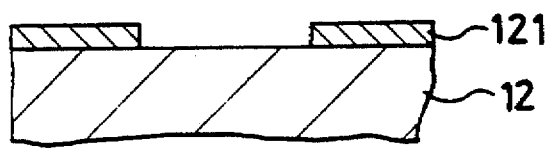
Figure 3:
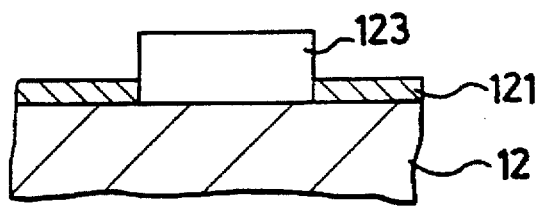
Figure 3:
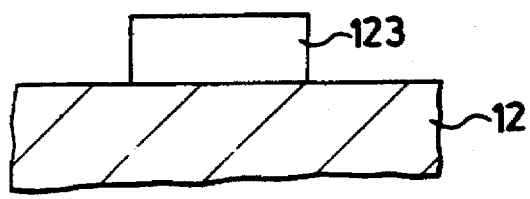

A process for selective growth of a single crystal of GaAs on a substrate of GaAs by the device shown in FIG. 1 will now be described with reference to FIG. 3.

First, about 1 to 2 μm of a substrate of GaAs 12 polished to be as smooth as a mirror surface is removed by etching according to an ordinary etching process. Then, an $Si_3N_4$ film 121 having a uniform thickness of approximately 2,000 Å (i.e., 200 nm) is formed by a plasma CVD process on the substrate 12, and, then, a photoresist 122 is coated on the film 121, as shown in FIG. 3A. Then a photoresist pattern as shown in FIG. 3B is formed by an ordinary photoetching process. Subsequently, the $Si_3N_4$ film 121 is selectively etched away by applying a buffer etchant with HF: $H_2O=1:5$, and, then, the photoresist 122 is removed, thereby leaving a mask pattern of the $Si_3N_4$ film 121 on the substrate 12, as shown in FIG. 3C. The surface of the wafer is then rinsed, and about 100 Å of the surface of the GaAs substrate 12 is etched away by applying an organic alkaline etchant containing trialkyl 2,1-hydroxyalkyl ammonium hydroxide (THAH), followed by rinsing and drying.

The substrate 12 formed with the mask pattern is mounted on the heater 10 in the crystal growth vessel 1 shown in FIG. 1, and the vessel 1 is evacuated to $10^{-7}$ to $10^{-8}$ Pa by opening the gate valve 2 and operating the ultrahigh-vacuum evacuating unit 3. Then, the GaAs substrate 12 is heated to, for example, about 300° to 800° C. by the hater 10, and TMG 8 is introduced as Ga-containing gas by holding the valve 6 open for 0.5 to 10 seconds and maintaining the internal pressure of the vessel 1 at $10^{-1}$ to $10^{-7}$ Pa. Subsequently, the valve 6 is closed, and the vessel 1 is evacuated again. Thereafter, $AsH_3$ 9 is introduced as As-containing gas by holding the valve 7 open for 2 to 200 seconds and maintaining the internal pressure of the vessel 1 at $10^{-2}$ to $10^{-7}$ Pa. In this way, selective growth of a single crystal of GaAs corresponding to at least a single monolayer on the exposed mask-free substrate surface can be attained. It is apparent that, by repeating the sequence of steps described above, successive single monolayers grown on the mask-free surface of the substrate 12 provide a monocrystalline GaAs layer of a desired thickness with dimensional precision as precise as a single monolayer, without causing growth of GaAs on the mask of the $Si_3N_4$ film 121, as shown in FIG. 3D.

Afterwards, the $Si_3N_4$ film 121 is removed by etching with a buffer etchant, whereby a monocrystalline selective growth layer of GaAs 123 having a desired thickness is formed on a desired surface area of the substrate 12 according to the mask pattern, as shown in FIG. 3E.

The above selective growth process has not yet been fully theoretically elucidated, but is based on the inventor's experiments.

Figure 4:
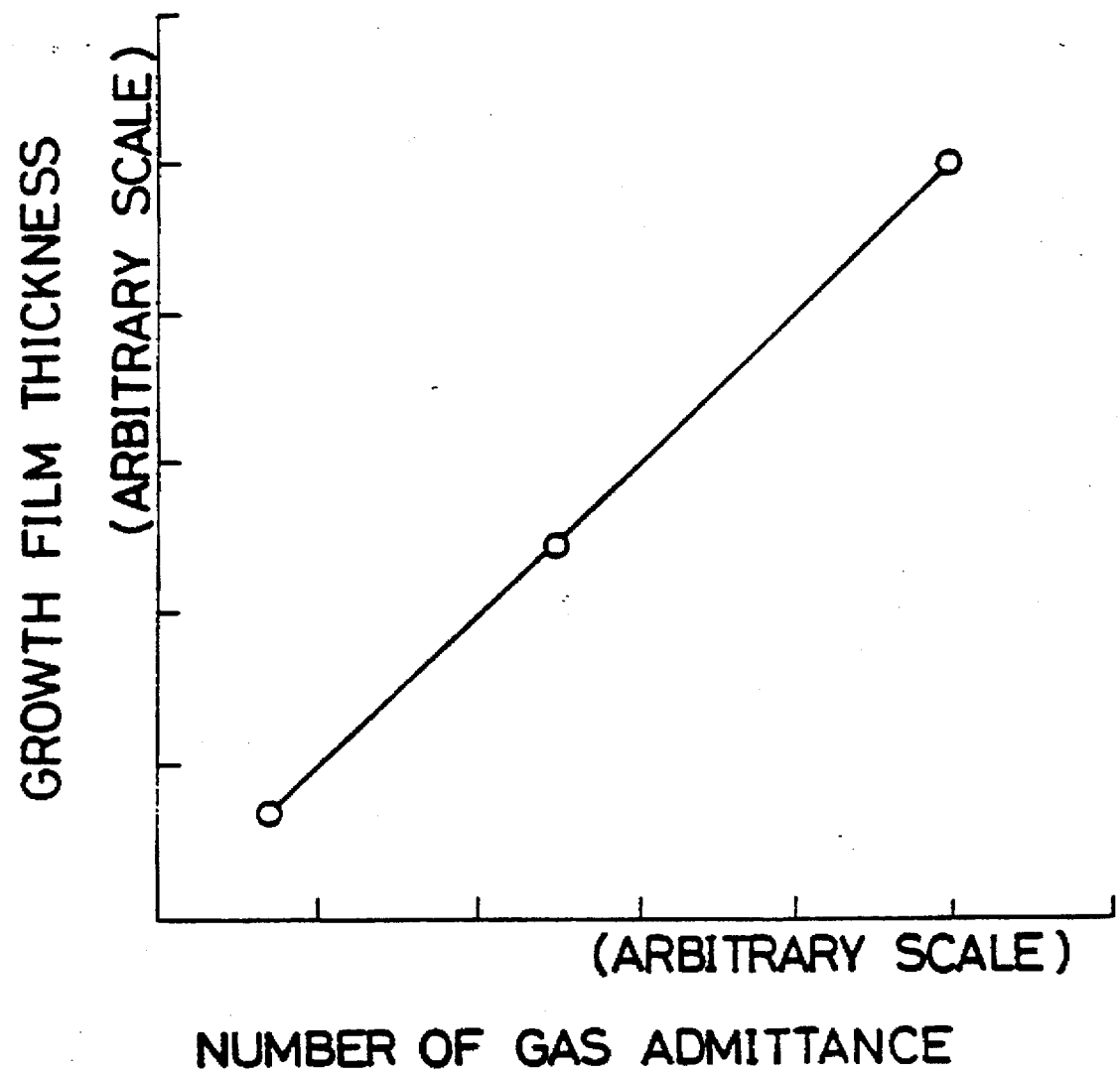
FIG. 4 is a graph showing the relation between the thickness of the film grown and the number of gas introduction cycles in the process carried out by the device shown in FIG. 1.

FIG. 4 shows the results of the experiments. The graph shows the relation between the thickness of the epitaxial growth layer of GaAs and the number of cycles of alternate introduction of TMG and $AsH_3$ as component-containing gases at a growth temperature of 500° C. The thickness of the epitaxial growth layer obtained was 1,100 Å when the cycle of alternate introduction of the gases 8 and 9 was repeated 400 times, 0.57μ when the cycle was repeated 2,000 times, and 1.13μ when the cycle was repeated 4,000 times. It should be noted that the thickness of the growth film and the number of gas introduction cycles are very linearly related to each other. It was thus confirmed that the thickness of the selective growth layer can be controlled by controlling the number of gas introduction cycles.

Figure 5:
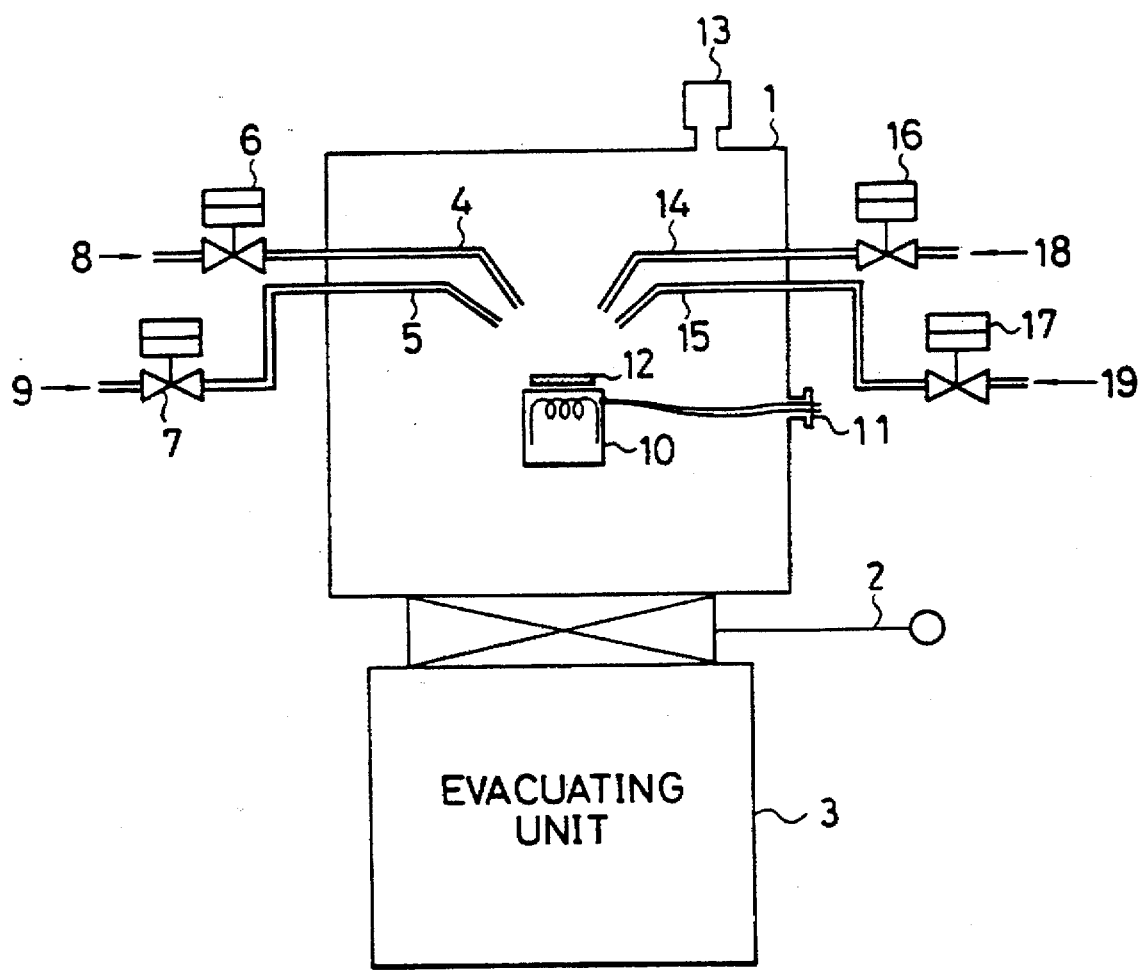
FIGS. 5 and 6 are schematic views showing the construction of crystal growth devices preferably used for carrying out different embodiments of the invention, respectively.

FIG. 5 shows another form of the crystal growth device, which is designed for doping with impurities. In FIG. 5, the same reference numerals are used to designate the same or equivalent parts appearing in FIG. 1. The construction is different from that of FIG. 1 in that nozzles 14 and 15 for introducing gaseous compounds for impurity doping are additionally provided in the crystal growth vessel 1, the nozzles 14 and 15 being provided with respective on-off valves 16 and 17 for controlling the amounts of gaseous compounds 18 and 19 containing II and VI group elements as respective impurity components introduced into the vessel 1.

To form a p-type growth layer with this device, TMG 8 and $AsH_3$ 9 as main component gases and dimethyl zinc (DMZn) 18 as an impurity gas are cyclically introduced. As another method, TMG 8 and DMZn 18 are introduced simultaneously but alternately with $AsH_3$ 9, or $AsH_3$ 9 and DMZn 18 are introduced simultaneously but alternately with TMG 8. As a further method, a first cycle consisting of simultaneous introduction of TMG and DMZn, evacuation, introduction of $AsH_3$ and evacuation, and a second cycle consisting of introduction of TMG only, evacuation, introduction of $AsH_3$ only and evacuation, may be alternately repeated to alternately form a layer doped with Zn and a layer not doped with Zn or to form a plurality of first layers alternated by second layers.

The impurity gas may be dimethylcadmium (DMCd), dim ethyl magnesium (DMMg), monosilane ($SiH_4$), germane ($GeH_4$), etc. Further, DMCd and DMZn may be simultaneously introduced.

For forming an n-type growth layer, dim ethyl selenium (DMSe) 19 as impurity gas is introduced cyclically with TMG 8 and $AsH_3$ 9. Alternately, TMG 8 and DMSe 19 are introduced simultaneously but alternately with $AsH_3$ 9.

The impurity gas in this case may be dimethyl sulfur (DMS), hydrogen sulfide ($H_2S$), hydrogen selenide ($H_2Se$), etc.

In this case, a molecular epitaxial growth layer having a desired distribution of the impurity concentration in the thicknesswise direction can be provided by setting the rate of supply of impurity gas to be lower than that of $AsH_3$ 9 and TMG 8, e.g., $10^{-3}$ to $10^{-6}$ and setting the gas introduction time to 0.5 to 10 seconds. Further, it is possible to produce pn junctions, non-uniform impurity concentration distributions, bipolar transistor structures such as npn, npin, pnp and pnip, field-effect transistor structures such as $n^+in^+$ and $n^+n^-n^+$, electrostatic induction transistor structures, pnpn thyristor structures, etc. by appropriately controlling the rate and time of supply of the impurity gases.

Since the doping with impurities can be done for desired ones of layers, it is possible to provide a very sharp impurity concentration distribution, which is very effective for the fabrication of very high speed transistors, integrated circuits, light-emitting diodes, etc.

Figure 6:
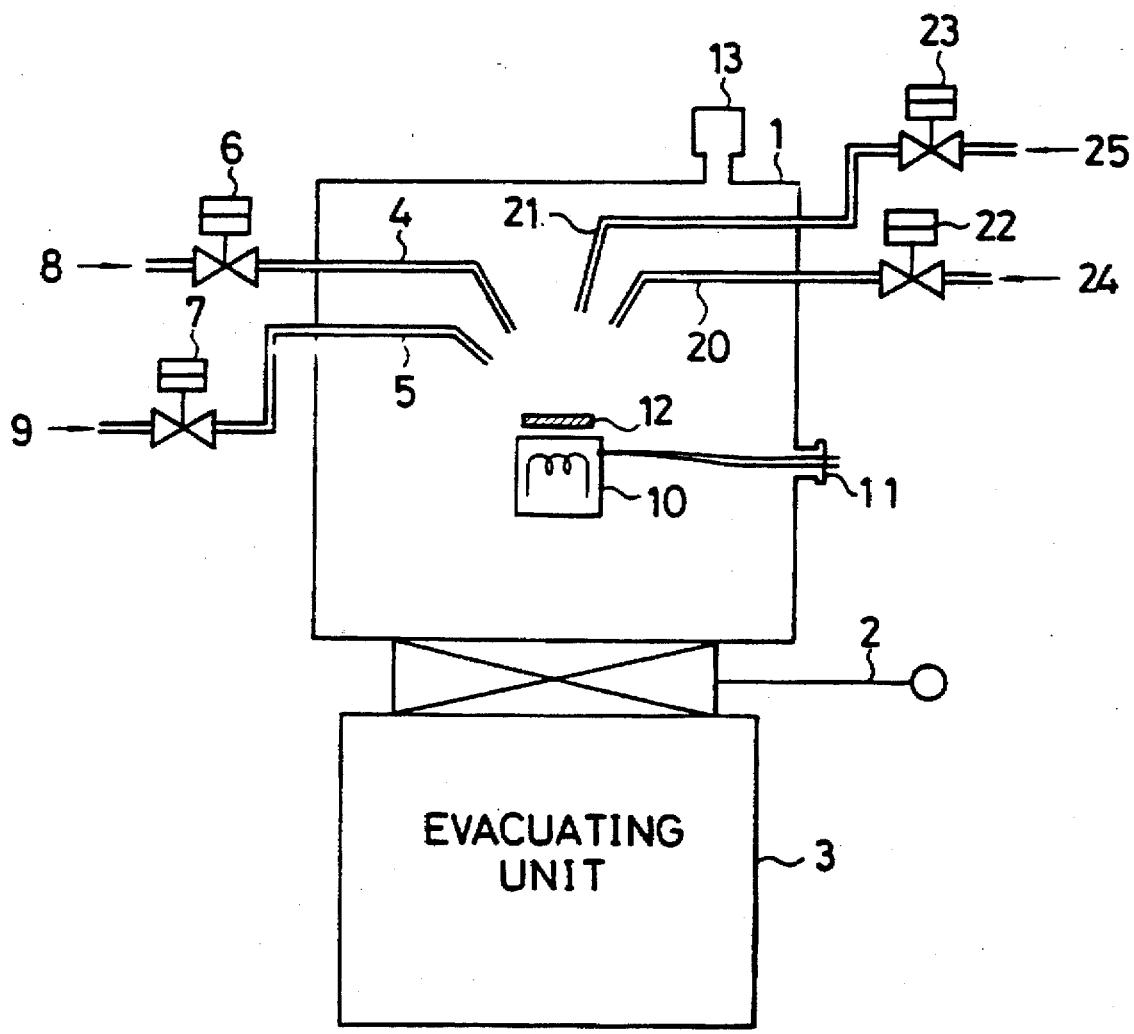

FIG. 6 shows a further form of the crystal growth device, which is designed for the growth of a mixed-crystal compound semiconductor. This device will now be described in connection with a case of growth of $Ga_{(1-x)}Al_xAs$ as the mixed crystal. In FIG. 6, the same reference numerals are used to designate the same or equivalent parts appearing in FIG. 1. The construction is different from that of FIG. 1 in that nozzles 20 and 21 for introducing a gaseous compound 24 containing Al as a III group element and silane ($SiH_4$) 25 through on-off valves 22 and 23 respectively are additionally provided in the crystal growth vessel 1.

With this structure, TMG 8, $AsH_3$ 9 and trimethyl aluminum (TMAl) 24, for instance, are introduced as component gases cyclically into the vessel 1. A mixed-crystal molecular epitaxial growth layer can be formed, which has a desired component ratio in the thicknesswise direction, by controlling the rate and time of supply of TMAl 24 with respect to TMG 8.

TMG 8 and TMAl 24 may be introduced simultaneously. Further, a mixture gas containing TMG and TMAl may be introduced from the nozzle 20.

Although $Ga_{(1-x)}Al_xAs$ has been taken as an example of the mixed crystal, other mixed crystals, e.g., those containing III and V group elements such as $GaAs_{(1-x)}P_x$, $In_xGa_{(1-x)}P$ and $In_xGa_{(1-x)}As$ and those containing II and V group elements such as $Hg_{(1-x)}Cd_xTe$, may also be formed.

Figure 7A:
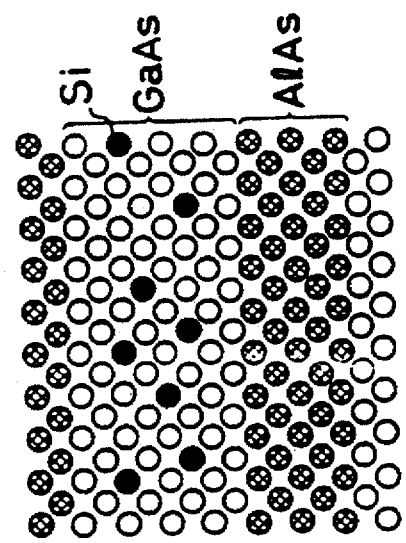
FIG. 7A illustrates the superstructure and FIG. 7B illustrates a gas introduction sequence.
Figure 7B:
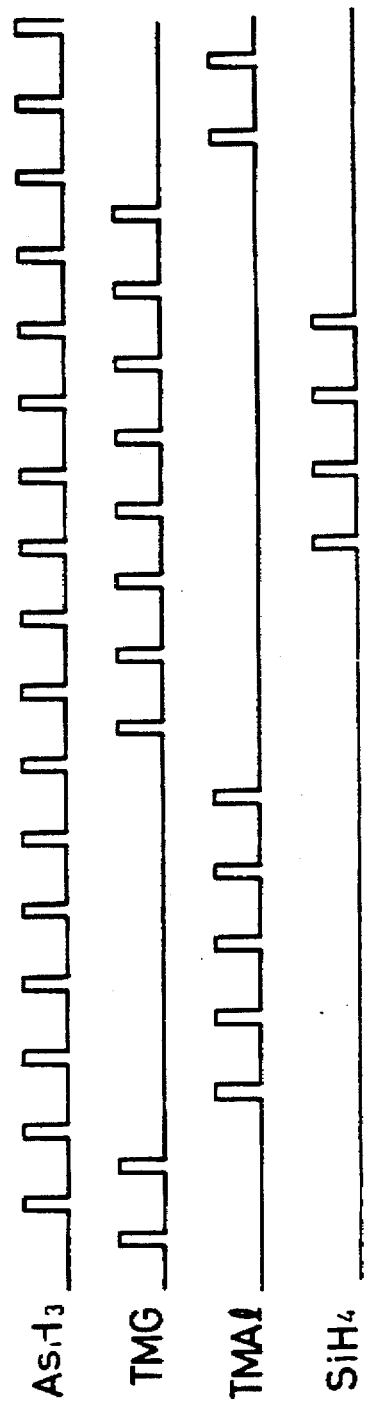

To form a superstructure $Ga_{(1-x)}Al_xAs$ as shown in FIG. 7A, a sequence as shown in FIG. 7B may be used. More specifically, in the first two cycles, TMG 8 and $ASH_3$ 9 are introduced alternately, in the succeeding five cycles and TMAl 24 and $ASH_3$ 9 are introduced alternately, and in the succeeding two cycles TMG 8 and $AsH_3$ 9 are introduced alternately. The following four cycles are impurity introduction cycles, in which silane ($SiH_4$) is introduced simultaneously with $AsH_3$ but alternately with TMG 8 through the nozzle 21 by on-off operating the valve 23. In other words, the on-off phases of the valves 23 and 26 are maintained the same in four successive cycles, followed by two cycles of undoped GaAs growth, in which TMG 8 and $AsH_3$ 9 are introduced alternately, and then by two cycles and undoped AlAs growth, in which TMAl and $AsH_3$ 9 are introduced alternately.

FIG. 8 shows a further form of crystal growth device, which is designed for the growth of a lattice-strain compensation, mixed-crystal compound semiconductor of quaternary or higher mixed crystal structure permitting independent control of the forbidden band width and lattice constant. It is well known in the art that lattice strain compensation can be attained when $Ga_{0.7}Al_{0.3}As_{0.99}P_{0.01}$, for instance, is formed by growth on a GaAs substrate. Accordingly, this device will now be described in connection with a case of growth of $Ga_{(1-x)}Al_xAs_{(1-y)}P_y$ as the mixed crystal.

In FIG. 8, the same reference numerals are used to designate the same or equivalent parts appearing in FIG. 1. The construction is different from that of FIG. 1 in that nozzles 26 and 27 for introducing gaseous compounds 30 and 31 containing Al in the III group and P in the V group through on-off valves 26 and 27 respectively are additionally provided in the crystal growth vessel 1.

With this structure, TMG 8, $AsH_3$ 9, TMAl 30 and phosphine ($PH_3$) 31, for example, are introduced as component gases cyclically into the vessel 1. In this case, the elements in the III and V groups may be introduced simultaneously. Further, a mixture gas prepared in advance may be introduced. The growth temperature and growth pressure are controlled substantially in the same way as in the case of the device shown in FIG. 1. A lattice-strain compensation, mixed-crystal compound semiconductor epitaxial growth layer can be formed by appropriately controlling the mixture ratio and the rate and time of introduction of the gases.

Figure 9:
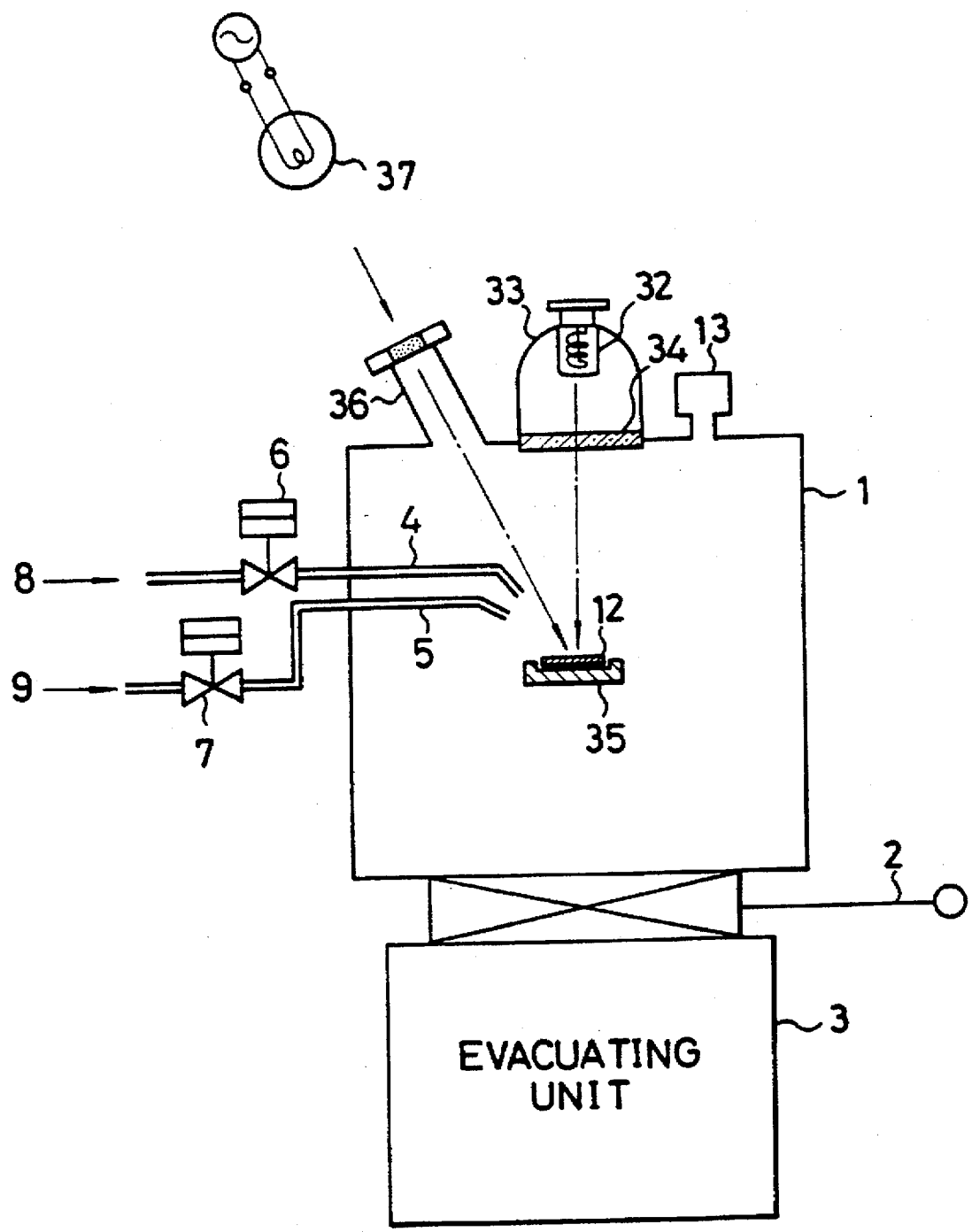

In the various forms of the device described above, the heater for heating the substrate 12 is provided in the crystal growth vessel 1. FIG. 9 shows a further form of the device, in which an infrared lamp 32 housed in a lamp case 33 disposed outside the crystal growth vessel 1 is used as a substrate heater. Infrared rays emitted from the lamp 32 in the lamp case 33 passes through a quartz glass plate 34 to irradiate the substrate 12 which is supported on a susceptor 35, thereby heating the substrate 12. With this structure, parts that are unnecessary for the crystal growth can be removed from the interior of the crystal growth vessel 1, thus eliminating generation of undesired gases of heavy metals or the like by the heat generated from the heater.

Furthermore, the crystal growth vessel 1 is associated with an optical system 36 co-operating with an external light source 37, e.g., a mercury lamp, a heavy hydrogen lamp, a xenon lamp, an excimer laser, an argon laser, etc., to irradiate the substrate 12 with light having a wavelength of 180 to 600 nm. In this case, the substrate temperature can be reduced to ensure growth of a single crystal having a still higher quality.

The ultrahigh-vacuum evacuating unit employed in the above forms of the device may be of well-known type, e.g., an ion pump. Further, an auxiliary vacuum vessel, a crystal transport device, etc. for the insertion and transport of the monocrystalline substrate into and out of the crystal growth vessel may be readily provided to improve the mass productivity of the device. Further, while GaAs has been referred to by way of example, the invention is of course also applicable to compounds of III and V group elements or compounds of II and IV group elements, e.g., InP, AlP and GaP. Further, the material of the substrate is in no way limited to GaAs, and it is possible to cause heteroepitaxial growth of a compound semiconductor on another compound substrate. Furthermore, various other changes and modifications may be made without departing from the scope and spirit of the invention.

Figure 10:
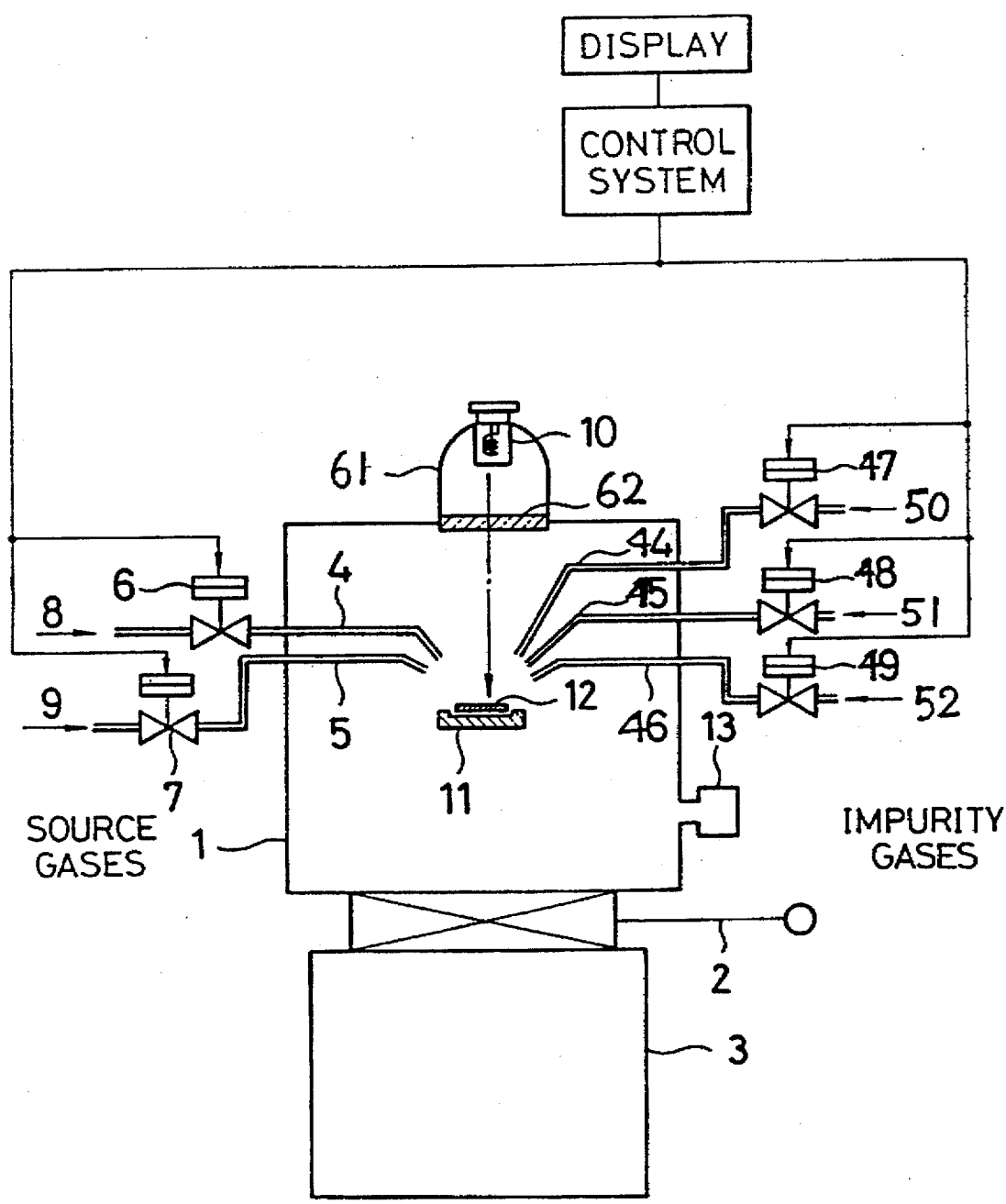
FIG. 10 is a schematic diagram of a system for growing crystals for use in an embodiment of the present invention.

FIG. 10 shows a structure of a system of molecular layer epitaxy to be used in an embodiment of the invention.

The components marked by reference numerals 1-13 are the same as discussed in connection with FIG. 1, and so need not be repeated here.

Also shown are nozzles 44, 45 and 46 for introducing gaseous compounds used for impurity doping, valves 47, 48 and 49 for opening and closing the feed paths for the gaseous compounds led to the nozzles 44, 45 and 46, a gaseous compound 50 containing a group II element, a gaseous compound 51 containing a group IV element, a gaseous compound 52 containing a group VI element, a lamp chamber 61 for containing the heater lamp 10, and a radiation transmitting window 62 formed of quartz glass.

Shortly, the growth chamber 1 is provided with the vacuum system 3 for maintaining an ultra high vacuum, the radiation source 10 for heating the substrate 12, and nozzles 4, 5, 44, 45 and 46 for feeding the constituent elements of the compound semiconductor and the impurity to be doped.

Monolayers, of GaAs, for example, can be epitaxially grown on the substrate 12 in a following manner.

First, the gate valve 2 is opened and the growth chamber 1 is evacuated by the ultra high evacuation system 3 to a vacuum of the order of $10^{-7}$ to $10^{-8}$ Pa. Next, the GaAs substrate 12 is heated by the heater 10 to a temperature of about 300° to 800° C., for example. Then, tri-methyl-gallium (TMG) 8 as a Ga-containing gas is introduced into the growth chamber 1 at a pressure of $10^{-1}$ to $10^{-7}$ Pa for 0.5 to 10 seconds by opening the valve 6. Thereafter, the valve 6 is closed and the residual gas in the growth chamber 1 is evacuated. Then, arsine ($AsH_3$) 9 as an As-containing gas is introduced into the growth chamber 1 at a pressure of $10^{-1}$ to $10^{-7}$ Pa for 2 to 200 seconds by opening the valve 7. Thereafter, the valve 7 is closed and the chamber 1 is evacuated to recover an ultra high vacuum. The above steps will constitute one cycle of growing one monolayer of GaAs on the substrate 12. By repeating the above-mentioned cycles, monolayers of GaAs can be successively grown to a desired thickness to form an epitaxial GaAs layer having a thickness controlled to the accuracy of monolayer order.

Now, doped epitaxial growth will be explained taking GaAs as an example. Arsine ($AsH_3$) may be used as a Ga-containing gas. TEG has an advantage of achieving a lower temperature growth and a lower background impurity concentration compared to TMG. Thus, epitaxially grown films of excellent crystallinity and a low impurity concentration of $10^{15}$ cm$^{-3}$ or less could be grown.

Now, molecular layer epitaxy with n-type impurity doping, using $AsH_3$ and TEG as the source gases and $Si_2H_6$ as the dopant gas, will be described. Silicon atom (Si) enters a Ga site substitutionally and becomes an n-type impurity. When the impurity gas is introduced selectively on the time axis, typically following four modes of doping can be considered:

(A) at the exhaustion of $AsH_3$, (B) at the introduction of TEG, (C) at the exhaustion of TEG, and (D) at the introduction of $AsH_3$.

Figure 11:
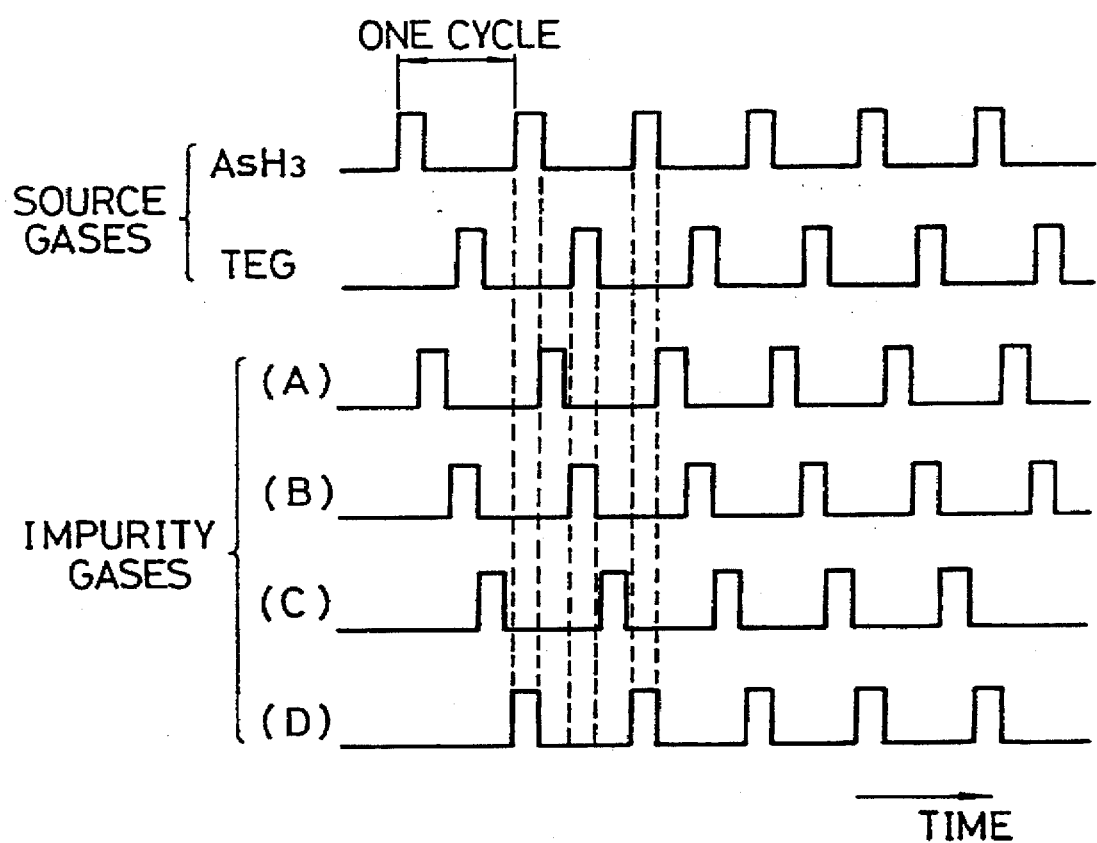
FIG. 11 is a timing chart for feeding source gases and an impurity gas in four modes of doping.

FIG. 11 illustrates these four modes of doping the impurity in a timing chart. One of the timings A, B, C and D will be selected as the mode of doping. Except the impurity doping, $AsH_3$ and TEG are alternately introduced and exhausted. One cycle of $AsH_3$ and TEG will form one monolayer. In accompanying with the monolayer growth, impurity is doped once a cycle. The timing of impurity doping is set at the above-mentioned four modes A, B, C and D.

In a cycle, $AsH_3$ gas was introduced at $4.2 \times 10^{-2}$ Pa for 10 seconds, TEG was introduced at $2.4 \times 10^{-4}$ Pa for two seconds, and $Si_2H_6$ was introduced at $8.6 \times 10^{-5}$ Pa. Conditions of film formation were kept same for the four modes of doping except the timing of doping $Si_2H_6$. Substrate temperature was kept at about 380° C. After the film formation, electrical properties and C-V (capacitance vs. voltage) characteristics were measured. It was confirmed that one monolayer (2.83 Å thick) was grown substantially in one cycle. The samples were made in the form of a diode as shown in FIG. 3 for use in electrical measurement.

Figure 12:
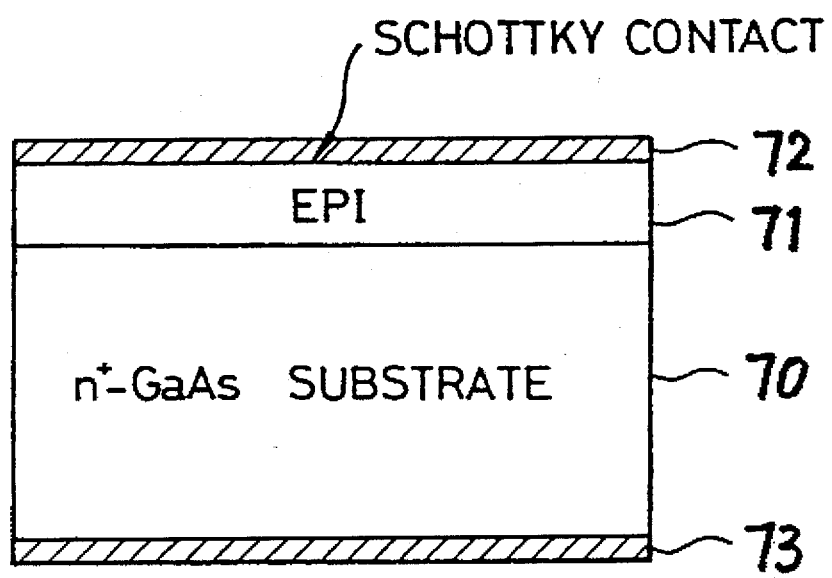
FIG. 12 is a cross-section of a semiconductor diode fabricated for the purpose of measuring thickness of the grown film.

In FIG. 12, reference numeral 70 denotes an N$^+$ substrate 71, a film epitaxially grown on the substrate 40 while being doped, a metal layer 72 deposited on the grown film for making a Schottky contact, and a metal film 73 forming an ohmic contact with the n$^+$ substrate. The C-V characteristics of this diode were measured and the spreading of the depletion layer was calculated. Then, the thickness of the epitaxially grown layer 71 can be calculated. In this way, it was confirmed nondestructively whether the epitaxial growth is effected monolayer by monolayer.

Figure 13:
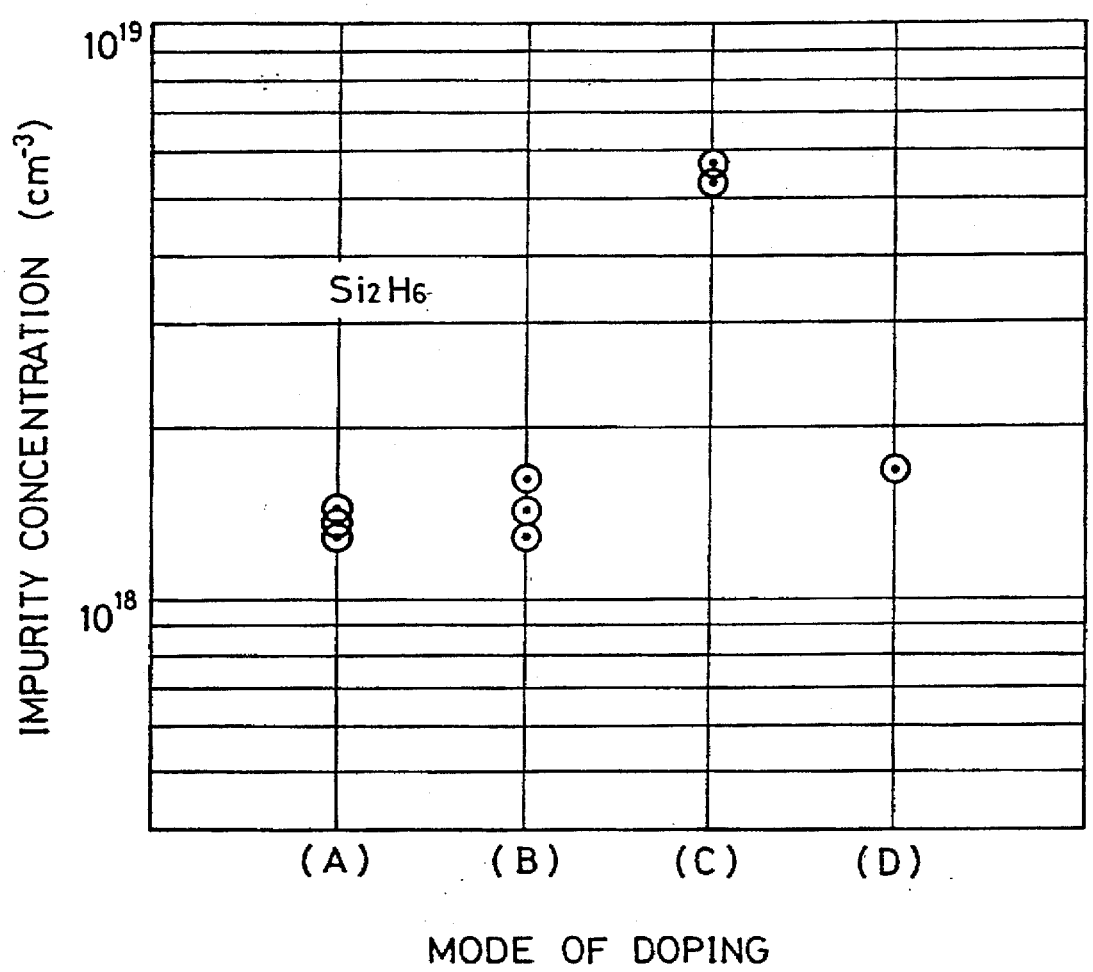
FIG. 13 is a graph showing the relation between the mode of doping disilane ($Si_2H_6$) and the impurity concentration in the doped grown layer.

FIG. 13 shows the impurity concentration in the epitaxial films grown under the above-mentioned conditions and doped with impurity in the modes of doping A, B, C and D. The impurity concentration was derived from the Hall effect measurement. In the mode C where doping is done when TEG is exhausted, the impurity concentration was $5.6 \times 10^{18}$ cm$^{-3}$, which is about four times as large as the impurity concentrations n = $1.4 \times 10^{18}$ cm$^{-3}$ for other three modes. It is known from this fact that doping efficiency is very high for the mode C. In this case, the order of gas introduction or gas feed is (group V, group III, group IV) or (group III, group IV, group V) which can be expressed as from the low group to the high group in the periodic table, to achieve growth of each doped monolayer.

Figure 14:
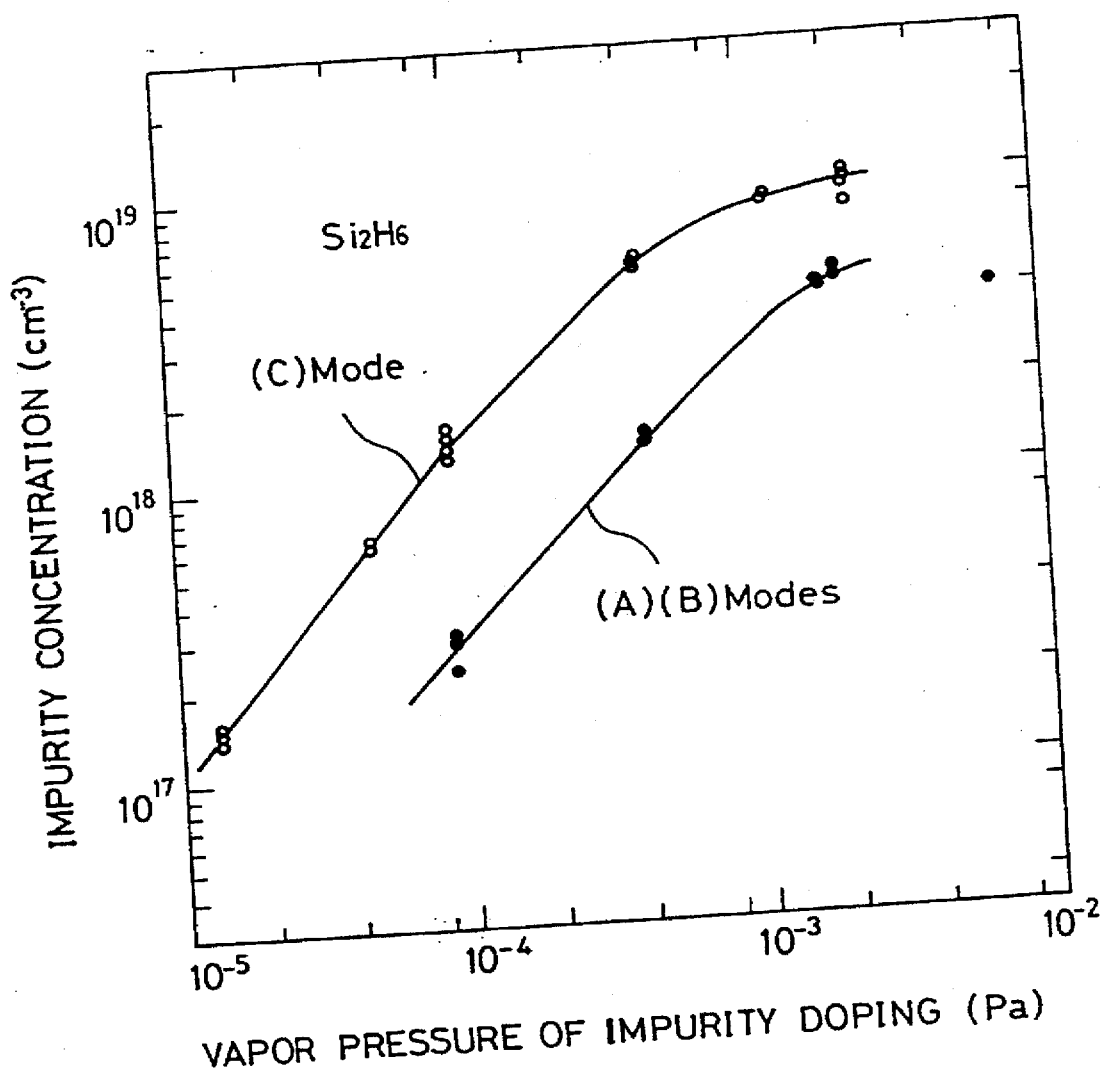
FIG. 14 is a graph showing the relation between the vapor pressure of impurity gas during doping and the impurity concentration in the doped grown layer for the modes of doping C and A&B.

Next, the conditions for introducing $AsH_3$ gas and TEG gas were set at constant and the quantity (i.e. pressure) of doping $Si_2H_6$ was varied. The obtained impurity concentrations or carrier concentrations are shown in FIG. 14. The carrier concentration increases almost linearly with the increase in the dopant ($Si_2H_6$) pressure, but is saturated around a certain value. The controllability of doping impurity by the dopant pressure was very good and a good linearity was obtained over three orders of magnitudes, in the range of $10^{15}$ to $4 \times 10^{18}$ cm$^{-3}$. Further, in the mode C, the saturation value was about $1 \times 10^{19}$ cm$^{-3}$, which is more than twice the values for the other modes. Furthermore, the surface of the grown layer according to mode C was mirror-like, while the surfaces of the grown layers for the other modes were roughened to some extent. Comparing the characteristics of the samples having an impurity concentration of $2 \times 10^{18}$ cm$^{-3}$ and doped by the four modes, the mobility of carriers for the crystal doped by the mode C was $\mu_n = 1600$ cm$^2$V$^{-1}$sec$^{-1}$, while the mobility in the samples doped by the other modes was about $\mu_n = 1300$ cm$^2$V$^{-1}$sec$^{-1}$. The sample doped by the mode C had the most preferable characteristics from the viewpoints of crystal surface morphology and carrier mobility.

From these results, it was found, in the case of a dopant gas $Si_2H_6$, that good crystals were obtained when the impurity is doped at a timing when group III and V elements are exhausted.

Next, p type doping using TMG as the impurity gas will be described.

In molecular layer epitaxy employing alternate introduction of $AsH_3$ and TMG, p-type epitaxial layers have been obtained which have impurity concentration ranging from $10^{18}$ to $10^{20}$ cm$^{-3}$. Such p-type layers have good crystallinity and are suited for use as heavily doped p$^+$-type layers. From the measurements of secondary ion mass spectroscopy (SIMS), etc., the impurity element in the grown layer is considered to be the carbon atom entered substitutionally in the group V, i.e. As, site. Thus, TMG can be considered to be the impurity gas for doping carbon atoms, which are the p-type impurity element in the GaAs crystal. Then, TMG is doped in the monolayers epitaxy of ($AsH_3$, TEG). The growth conditions were selected the same as those for doping $Si_2H_6$. The period of introducing TMG was set at 2 seconds and the quantity of dopant (pressure) was varied.

The p-type impurity concentration could also be well varied in the range of $10^{15}$ to $5 \times 10^{18}$ cm$^{-3}$ with good controllability.

Figure 15:
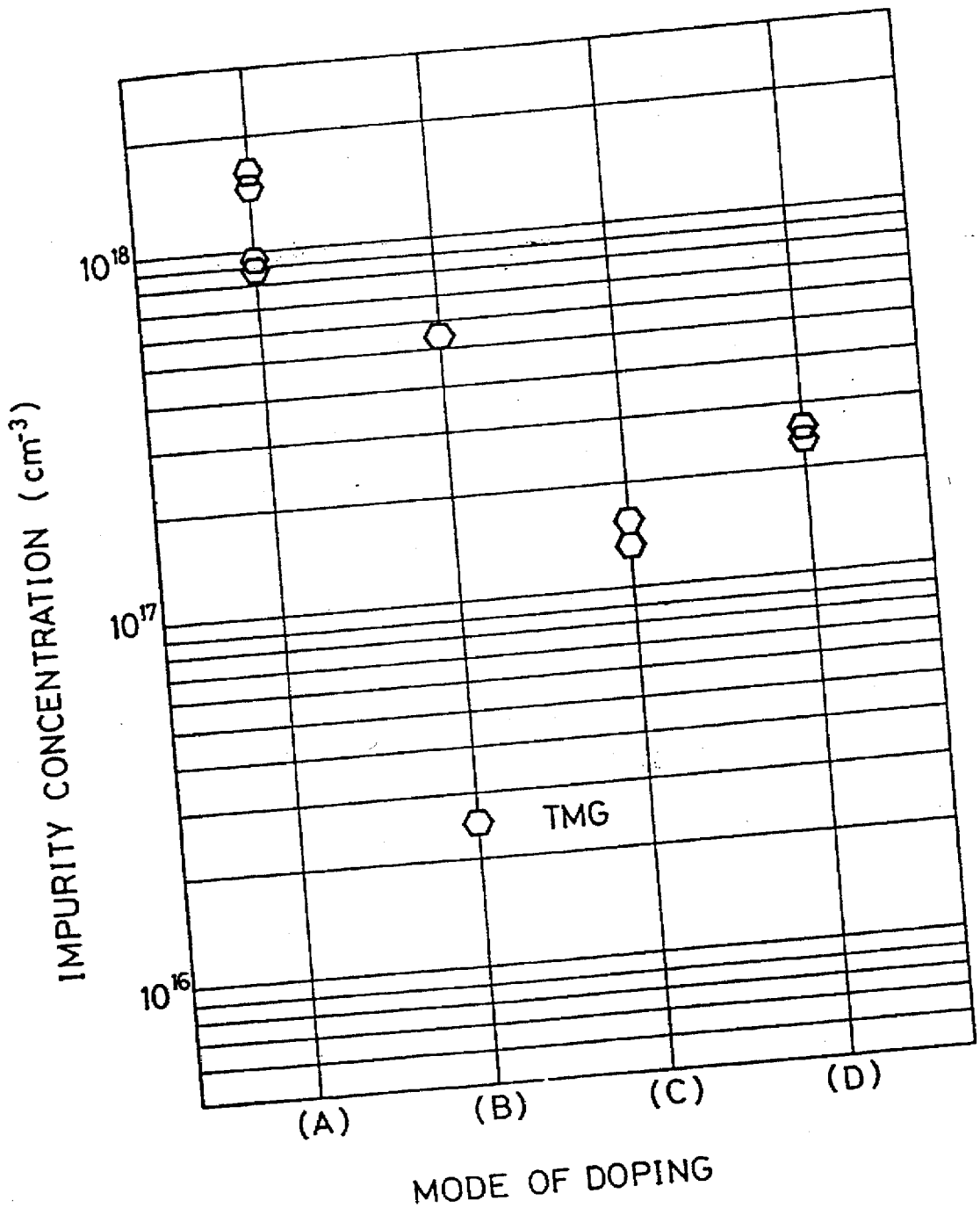
FIG. 15 is a graph showing the relation between the mode of doping trimethyl-gallium (TMG) and the impurity concentration in the doped grown layer.

In an example, the pressure of TMG in doping was set at $2.1 \times 10^{-4}$ Pa, the period of doping was set at 2 seconds, and the conditions of introducing $AsH_3$ and TEG, etc. were selected the same as those in the embodiment of FIG. 13. The mode dependency of doping obtained in this case is shown in FIG. 15. The lower mark on axis B is not a data but a legend. The doping efficiency was the highest for the mode A and was lowest for the mode C. This mode dependency of the doping efficiency is a reversed one to that for the case of doping $Si_2H_6$. In this p-type doping, the best doping efficiency is considered to be obtained when molecular layer epitaxy is achieved by introducing (group III–group V) elements and then the impurity gas of group IV, carbon, in this order. From the Hall mobility and the surface morphology, modes A and C were found to be better than other modes B and D.

Then, doping of impurity gases of group II and group VI elements were carried out. Using di-methyl-cadmium (DMCd) as an impurity gas, p type layers having an impurity concentration in the range of $10^{15}$ to $1\times10^{18}$ cm$^{-2}$ were formed with good controllability. Doping was better effected when the impurity gas containing group II element is introduced when group III or V element is exhausted. In the case of $H_2Se$ (hydrogen selenide), the impurity concentration could only be controlled in the range of $10^{18}$ to $2\times10^{19}$ cm$^{-3}$ due to the memory effect. In the case of di-ethyl-selenium (DESe), the impurity concentration could be controlled in a wide range of $10^{15}$ to $2\times10^{19}$ cm$^{-3}$. In this case, impurity was better doped when doped after the exhaustion of group V element. Also in doping group II or VI impurity, modes A and C, where impurity gas is introduced when group III or V element has been exhausted, were found to be preferable from the points of good surface morphology, higher carrier mobility, and good crystallinity. The mode dependency of doping efficiency for these impurity gases was tested under the same conditions of forming GaAs layer as those for the case of $Si_2H_6$ doping. It was found that the doping efficiency has the following characteristic.

Taking GaAs as an example, it was found that the doping efficiency becomes the maximum to achieve a higher impurity concentration when an impurity containing gas is introduced at the exhaustion after the introduction of Ga or As containing gas. When a group IV element is used as an n-type impurity, the doping efficiency is high when gas introduction is in the order of (III-V)-VI or (V-III)-VI. When a group II element is used as a p-type element, the doping efficiency is high when gas introduction is in the order of II-(III-V) or II-(V-III).

Simply controlling the doping gas is not enough; one must select the introduction timing of the dopant gas. In principle, impurity sites in the crystal lattice can be controlled by selecting the introduction timing of the dopant gas. More specifically, for a III-V compound semiconductor, the impurity Si in the group III site acts as the donor whereas that in the group V site acts as the acceptor. Therefore, the site control of impurities such as Si can be performed by selecting the timing of dopant gas introduction to determine the dopant type, i.e., donor or acceptor. By selecting the timing of dopant gas introduction appropriately, the surface morphology of the grown film can be improved remarkably for the same carrier density as that of Suntola et al. (U.S. Pat. No. 4,058,430), for instance, so as to realize a mirror-like surface morphology.

Figure 16A:
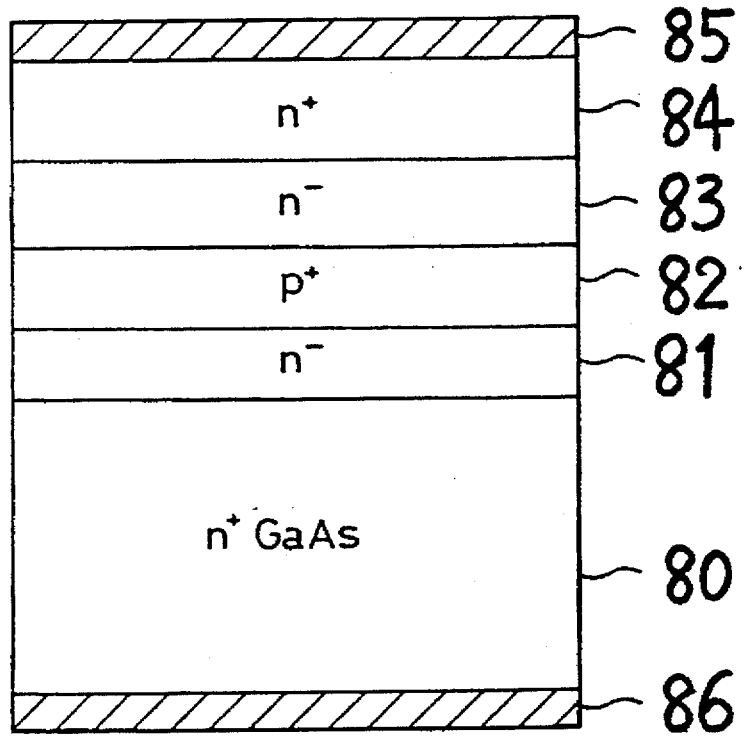
FIG. 16A is a cross-section of a semiconductor diode formed to have predetermined impurity concentration distribution according to an embodiment of the invention.
Figure 16B:
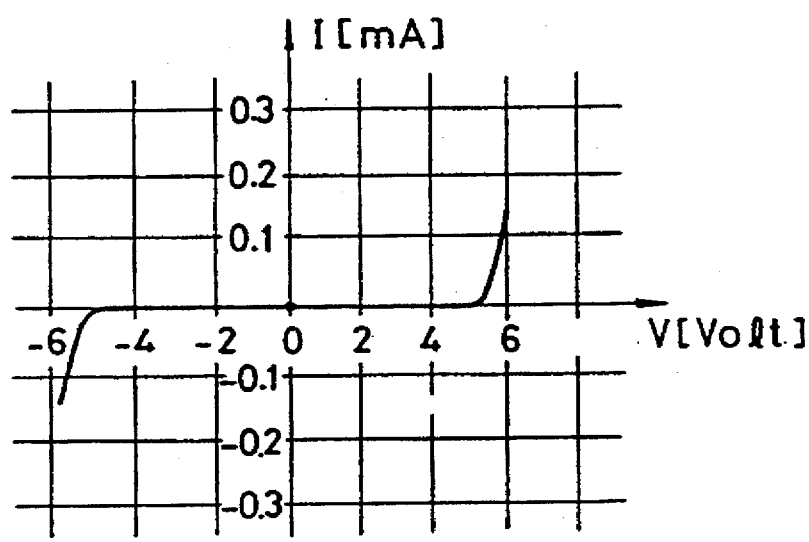
FIG. 16B is a graph showing the current (I) versus voltage (V) characteristic of a diode of FIG. 16A.

Diodes may be made through the impurity doping in molecular layer epitaxy as described above. In FIG. 16A, on an n$^+$-type GaAs substrate 80, an n$^-$-type layer 81, a p$^+$-type layer 82, an n$^-$-type layer 83 and an n$^+$-type layer 84 of respective predetermined impurity concentration and thickness of 300, 300, 300 and 600 monolayers were epitaxially grown successively. Thereafter, AuGe/Au layer is deposited on the both surfaces and sintered at 350° C. in $N_2$ atmosphere to form good ohmic contacts 85 and 86 according to the ordinary diode manufacture. The electrode area was selected to be 300 μm square. The I-V characteristics are good with a breakdown voltage of more than 5 volts.

In the above description, this invention has been explained taking mainly doping of GaAs as examples. The invention is applicable to other III-V compound and mixed crystal semiconductors such as InP, GaP, GaAlAs, InGaAlAsP and to other compound semiconductors. As the gases containing group II element or group V element, those gases containing group III element or group V element, those gases such as tri-methyl-indium (TMIn), tri-ethyl-indium (TEIn), tri-isobutyl-indium (TIIn), phosphine (PH$_3$), tri-methyl-alumininm (TMAl), tri-ethyl-aluminium (TEAl), and tri-isobutyl-aluminium (TIAl) may be used. As the impurity gas, those gases as described hereinabove which contain group II, group IV or group VI element may be used. Impurity doping in a wide range of $10^{15}$ to $5\times10^{18}$ cm$^{-3}$ could be carried out with good controllability while maintaining the features of molecular layer epitaxy.

As described above, according to the present invention, molecular layer epitaxy can be achieved at a low temperature with controlled doping for each monolayer. Very sharp impurity concentration distribution can be formed according to the designed value. By the selection of doping timing, the doping efficiency can be increased and the maximum impurity concentration will be raised. Particularly, when the impurity is introduced after the exhaustion of a gas containing a group III or V element, the surface state and the crystallinity were found to be good. Formation of heavily doped high quality layers required for high speed/high integration devices can be achieved easily at a low temperature with thickness control of monolayer order. Therefore, this invention exhibits excellent functions and effects in the formation of devices which require extreme size accuracy.

As shown in FIG. 7 of an article entitled "Molecular Layer Epitaxy" by Nishizawa et al. (J. Electrochemical Society, vol. 132, No. 5, May 1985), all grown films which were obtained in the monolayer growth region by using TMG were P-type having a carrier density of about $5\times10^{18}$ to $1\times10^{20}$ cm$^{-3}$, which means that the residual carbon density in the grown film is at least $5\times10^{18}$ to $1\times10^{20}$ cm$^{-3}$. Such residual carbon density was not previously experienced in conventional MO-CVD crystal growth process. Thus, such conventional MO-CVD processes did not mix carbon from TMG into the grown film as much as is realized by a molecular layer epitaxy process in which TMG and AsH$_3$ are alternately introduced under ultrahigh vacuum. Although an article entitled "Photostimulated molecular layer epitaxy" by Nishizawa et al., J. Vac. Sci. Technol., May/June 1986, pages 706–710, discusses that residual carbon concentration is drastically reduced by replacing TEG for TMG, the article does not mention a doping process.

If a non-doped p-type semiconductor having a carrier density of $5\times10^{18}$ to $1\times10^{20}$ cm$^{-3}$ is doped with donors such as Si or Se, n-type grown film will never be realized. Since the maximum donor density achieved by the conventional epitaxial growth methods is about $5\times10^{14}$ to $1\times10^{19}$ cm$^{-3}$, all electrons released from donors will be compensated due to the presence of carbon acceptors. Further, the interaction between donors and carbon acceptors originally mixed in the semiconductor prevent the donors from mixing into the semiconductor so that the doping with the donor tends to be prevented. Accordingly, if TMG is replaced for TEG in the cyclical doping process in accordance with the present invention, it would be difficult to obtain an n-type grown film. Thus, the ease in attaining an n-type film from a cyclical doping process that employs TEG in accordance with a preferred embodiment of the present invention is a surprising and unexpected result.

In accordance with the present invention, the doping mode or order of gaseous component introduction depends on the type of compound of the source gas, such as whether the source gas is a hydride or an organic compound. For example, when an organic compound of the group III element Ga and a hydride ($AsH_3$) of the group V element As are used with a dopant compound of the group IV element Si ($Si_2H_6$), the doping efficiency is enhanced by introducing the dopant compound $Si_2H_2$ after the introduction of the organic compound so that the doping mode group of III-IV-V results. With a dopant compound of the group VI element Se ($Se(C_2H_5)_2$), the doping efficiency is enhanced by introducing the compound $Se(C_2H_5)_2$ after the introduction of the group V element ($AsH_3$) due to the promotion of the surface reaction so that the doping mode group of III-V-VI results.

An impurity tends to be incorporated into a Ga site when introduced immediately after the introduction of Ga, whereas the impurity tends to be incorporated into an As site when introduced immediately after the introduction of As. Typical impurities may be an element of any of the groups II, IV or Vi. An element from group II that is incorporated into the Ga site serves as an acceptor and an element from group IV that is incorporated into the Ga site serves as a donor, but would serve as an acceptor in the As site. An element from the group VI that is incorporated into the As site serves as a donor. Thus, preferable deposition order by group (or doping mode) is:

II-III-V

III-IV-V (the group V element serves as a donor)

III-V-IV (the group IV element serves as an acceptor)

III-V-VI

Since silicon (an element of group IV) is used as a donor for most cases, the proper doping mode or order of gaseous component introduction generally follows an ascending order of source gas group type when all the groups II to VI are taken into consideration. Thus, selection of the timing of doping with respect to the source gas introductions is based on the desired dopant type for the monolayer being grown (e.g., to determine whether the impurities should serve as donors or acceptors), as well as the on the desired impurity concentration level. The determination of the sequence of source gas and impurity gas introductions is based on the type of impurity being doped.

While the foregoing description and drawings represent the preferred embodiments of the present invention, it will be understood that various changes and modifications may be made without departing from the spirit and scope of the present invention.

What is claimed is:

1. A method of doping a compound semiconductor single crystal layer being grown in monolayers on a heated substrate in a growth chamber by alternate introduction of source gases, the growth chamber being evacuated continuously at a continuous rate of evacuation throughout the whole method, the method comprising the steps of:

(a) introducing a first source gas containing one constituent element of the compound into the growth chamber of at least a sufficient quantity for growing one monolayer, the supply of the first source gas being thereafter stopped and the growth chamber still being kept under the continuous rate of evacuation to evacuate residual of the first source gas;

(b) introducing a second source gas containing another constituent element of the compound into the growth chamber of at least a sufficient quantity for growing one monolayer, the supply of the second source gas being thereafter stopped and the growth chamber still being kept under the continuous rate of evacuation to evacuate residual of the second source gas;

(c) doping an impurity gas into the growth chamber, the impurity gas being of a particular type and having impurities which enter into sites in the monolayer being grown;

(d) initially carrying out steps (a), (b) and (c) to grow a monolayer on the substrate and then growing monolayers one over the other by cyclically repeating steps (a), (b) and (c) to grow a new monolayer on the monolayer just previously grown; and (e) selectively implementing an order in which steps (a), (b) and (c) take place during each cycle of step (d) based on the particular type of impurity gas being doped and selectively timing when step (c) takes place with respect to the timing of steps (a) and (b) based on obtaining a desired dopant type for the monolayer being grown and a desired level of impurity concentration in the monolayer being grown, wherein said compound is a group III-V compound and the impurity gas contains an element belonging to one of group II, group IV and group VI of the periodic table, the constituents from the first source gas are of a group III element and the constituents from the second source gas are of a group V element, the order in which steps (a), (b) and (c) are carried out is in accordance with a sequence selected from the group consisting of:

steps (a), (c) and (b) in succession where impurities from the impurity gas are selected from the group consisting of group IV element forming a donor, group II element and group VI element;

steps (a), (b) and (c) in succession where impurities from the impurity gas are selected from the group consisting of group IV element forming an acceptor, group II element and group VI element, whereby the continuous evacuation causes evacuation of residual waste of the first source gas, the second source gas, and the impurity gas.

2. A method of doping a compound semiconductor single crystal layer being grown in monolayers on a heated substrate in a growth chamber by alternate introduction of source gases, the growth chamber being evacuated continuously at a continuous rate of evacuation throughout the whole method, the method comprising the steps of:

(a) introducing a first source gas containing one constituent element of the compound into the growth chamber of at least a sufficient quantity for growing one monolayer, the supply of the first source gas being thereafter stopped and the growth chamber still being kept under the continuous rate of evacuation to evacuate residual of the first source gas;

(b) introducing a second source gas containing another constituent element of the compound into the growth chamber of at least a sufficient quantity for growing one monolayer, the supply of the second source gas being thereafter stopped and the growth chamber still being kept under the continuous rate of evacuation to evacuate residual of the second source gas;

(c) doping an impurity gas into the growth chamber, the impurity gas being of a particular type and having impurities which enter into sites in the monolayer being grown;

(d) initially carrying out steps (a), (b) and (c) to grow a monolayer on the substrate and then growing monolayers one over the other by cyclically repeating steps (a), (b) and (c) to grow a new monolayer on the monolayer just previously grown; and (e) selectively implementing an order in which steps (a), (b) and (c) take place during each cycle of step (d) based on the particular type of impurity gas being doped and selectively timing when step (c) takes place with respect to the timing of steps (a) and (b) based on obtaining a desired dopant type for the monolayer being grown and a desired level of impurity concentration in the monolayer being grown, wherein the order in which steps (a), (b) and (c) take place is in accordance with an ascending numerical order of periodic table group types associated with the first source gas, the second source gas and the impurity gas, wherein the compound is a group III-V compound and the impurity gas contains an element belonging to one of the group II, group IV serving as a donor and group VI of the periodic table, whereby the continuous evacuation causes evacuation of residual waste of the first source gas, the second source gas, and the impurity gas.

3. A method as in claim 2, wherein the compound is GaAs.

4. A method as in claim 2, wherein the impurity gas is one of di-methyl-cadmium (DMCd), $Si_2H_6$, tri-methyl-gallium (TMG), di-ethyl-selenium (DESe), and $H_2Se$.

5. A method as in claim 2, wherein the impurity gas contains silicon serving as an n-type impurity and the step (c) is carried out after exhausting in each cycle waste second source gas which containing gallium.

6. A method as in claim 2, wherein the impurity gas contains carbon serving as a p type impurity and the step (c) is carried out after exhausting in each cycle waste first source gas which contains arsenic.

7. A method as in claim 1, wherein the substrate is heated to a temperature of about 300° C. to 800° C.

8. A method as in claim 1, wherein the second source gas is triethyl gallium (TEG).

9. A method as in claim 2, wherein the constituents from the first source gas are of a group III element and the constituents from the second source gas are of a group V element, the order in which steps (a), (b) and (c) are carried out is in accordance with a sequence selected from the group consisting of steps (c), (a) and (b) in succession where impurities from the impurity gas are of the group II element, steps (a), (c) and (b) in succession where impurities from the impurity gas are of the group IV element forming a donor, steps (a), (b) and (c) in succession where impurities from the impurity gas are of the group IV element forming an acceptor, and steps (a), (b) and (c) in succession where impurities from the impurity gas are of the group VI element.

10. A method as in claim 1, wherein the repeating includes successively growing monolayers on the substrate to a desired thickness to form an epitaxial layer with a thickness controlled to an accuracy of monolayer order.

11. A method as in claim 1, wherein steps (a) to (e) take place to grow the crystal layer with desired impurity concentration, crystalline quality, carrier mobility and surface morphology.

12. A method as in claim 1, wherein the growth chamber has a discharge area through which the continuous evacuation takes place, the substrate being arranged between the discharge area and where the first and second source gas introductions take place within the growth chamber.

13. A method as in claim 1, wherein the step (a), (c), and (b) in succession of doping takes place so that the grown crystal layer has a mirror-like surface.

14. A method as in claim 1, wherein the step (a), (c), and (b) in succession of doping takes place so that mobility of carriers for the crystal layer reaches 1600 $cm^2V^{-1}sec^{-1}$.

15. A method as in claim 1, wherein the first source gas is arsine.

16. A method of forming a single crystalline thin fill of a III-V or a II-VI compound semiconductor comprising the steps of:

(a) continuously evacuating the interior of a crystal growth vessel at a constant rate of evacuation;

(b) heating a substrate disposed in the crystal growth vessel to a temperature of from about 300 to 800 degrees C;

(c) introducing into the crystal growth vessel, under a first deposition pressure of from about $10^{-1}$ to $10^{-7}$ Pascal and for a first time period of from about 0.5 to 200 seconds, sufficient quantity of gaseous molecules of a first compound to form at least a single molecular layer of the first compound on the substrate, the first compound selected from the group consisting of group III and group II compounds respectively, which first compound contains a first constituent element of the III-V or II-VI compound semiconductor;

(d) further introducing into the crystal growth vessel, under a second deposition pressure of from about $10^{-1}$ to $10^{-7}$ Pascal and for a second time period of from about 0.5 to 200 seconds, sufficient quantity of gaseous molecules of a second compound to form at least a single molecular layer of the second compound on the substrate, the second compound selected from the group consisting of group V and group VI compounds respectively, which second compound contains a second constituent element of the II-V or II-VI compound semiconductor; a single monolayer or a dimolecular layer growing in one cycle of said introduced gaseous molecules of first and second compounds corresponding to a saturation thickness in one cycle, the single-crystalline film being at least n times as thick as a single molecular layer of the compound semiconductor, where n is an integer of 1, 2 or larger to cause growth of a monocrystalline thin film of the compound semiconductor having dimensions as precise as a single molecular layer, the step (a) being continuous for evacuating any waste of the gaseous molecules introduced to form the first and second compound;

introducing first dopant gaseous molecules, the first dopant gaseous molecules being of a first dopant compound containing a first dopant element of the GaAs compound semiconductor;

introducing second dopant gaseous molecules, the second dopant gaseous molecules being of a second dopant compound containing a second dopant element of the GaAs compound semiconductor; and cyclically repeating the steps (c) and (d) while heating the substrate and continuously evacuating the growth chamber so as to cause growth of a single-crystalline thin film of the compound semiconductor having a thickness determined by the number of the cyclical repetitions, the thickness being dimensionally as precise as a monolayer.

17. A method as in claim 16, wherein the step of heating the substrate includes irradiating the substrate with light having a wavelength of 180 to 600 nm.

18. A method as claim 16, wherein the first compound is selected from the group consisting of TMG, TEG, DEGaCl, GaBr$_3$ and GaI$_3$, and the second compound is selected from the group consisting of TMAs, AsCl$_3$, AsBr$_3$ and AsH$_3$, and the compound semiconductor is GaAs.

19. A method as in claim 16, wherein:
   (a) the first dopant gaseous molecules are molecules of a first dopant compound selected from the group consisting of DMZn, DEZn, DECd, DMHg, DEHg and B$_2$H$_6$ and providing gaseous molecules containing a p-type dopant element of the GaAs compound semiconductor;
   (b) the second dopant gaseous molecules are molecules of second dopant compound selected from the group consisting of SiH$_4$, GeH$_4$, SnH$_4$, PbH$_4$, DMSe, DMTe, H$_2$S, H$_2$Se, H$_2$Te and H$_2$Po and providing gaseous molecules containing n-type dopant elements of the compound semiconductor, and
   (c) the first dopant gaseous molecules and the second dopant gaseous molecules are individually introduced simultaneously with at least one of the gaseous molecules of the first compound and the gaseous molecules of the second compound, wherein a dopant concentration distribution in the thicknesswise direction is provided.

20. A method as in claim 16, wherein a cycle of causing growth of at least one molecular layer is achieved by:
   (a) introducing Al as the gaseous molecules of the first compound selected from the group consisting of TMAl, TEAl, DMAlCl, AlCl$_3$, AlBr$_3$ and AlI$_3$;
   (b) introducing, simultaneously with the introducing Al as the gaseous molecules of the first compound gaseous molecules of a second compound containing at least one element of the Ga$_{(1-x)}$Al$_x$As compound semiconductor other than Al, and
   (c) further introducing, simultaneously with introducing Al as the gaseous molecules of the first compound and gaseous molecules of a second compound containing at least one element of the Ga$_{(1-x)}$Al$_x$As compound semiconductor other than Al, gaseous molecules of a third compound which third compound contains a third constituent element of the Ga$_{1-x}$)Al$_x$As compound semiconductor other than Al and other than the gaseous molecules of the second compound, where 0<x<1, and evacuating the interior of the crystal growth vessel, and repeating the simultaneous introduction of the gaseous molecules containing Al and the gaseous molecules containing at least one element other than At, and the gaseous molecules of a third compound containing a third constituent element of the Ga$_{(1-x)}$Al$_x$As compound semiconductor, and evacuation to form a crystalline thin film of the Ga$_{(1-x)}$Al$_x$As compound semiconductor.

21. A method as in claim 16, further comprising the step of introducing into the crystal growth vessel gaseous molecules of a third compound selected from the group consisting of group II, group III, group V, group VI compounds, which third compound contains a third constituent element of the III-V or II-VI compound semiconductor, the third constituent element being selected from the group consisting of group II, III, V and VI elements other than the first and second constituent elements, the third constituent element being selected from the group consisting of group III and group V elements when the compound semiconductor is a III-V compound semiconductor, and the third constituent element being selected from the group consisting of group II and group VI elements when the compound semiconductor is a II-VI compound semiconductor to thereby form a heterogeneous structure of a binary compound semiconductor and a ternary compound semiconductor containing at least two different compound semiconductors on the substrate.

22. A method as in claim 21, further comprising the additional step of introducing into the crystal growth vessel gaseous molecules of a fourth compound selected from the group consisting of group II, group III, group V, group VI compounds, which fourth compound contains a fourth constituent element of the III-V or II-VI compound semiconductor, the fourth constituent element being selected from the group consisting of group II, III, V and VI elements other than the first, second or third constituent elements, the fourth constituent element being selected from the group consisting of group III and group V elements when the compound semiconductor is a III-V compound semiconductor, and the fourth Constituent element being selected from the group consisting of group II and group VI elements when the compound semiconductor is a II-VI compound semiconductor, to thereby form a heterogeneous structure of a compound semiconductor and a quaternary compound semiconductor consisting of at least two different compound semiconductors on the substrate by growth.

23. A method as in claim 21, wherein the step of introducing the gaseous molecules of the third compound is performed simultaneously with the step of introducing the gaseous molecules of the first compound, and the third compound is selected from the group of group V and group VI compounds.

24. A method as in claim 22 wherein the step of introducing the gaseous molecules of the fourth compound is performed simultaneously with the step of introducing the gaseous molecules of the second compound, and the fourth compound is selected from the group of group III and group II compounds.

25. A method as in claim 1, wherein the compound is GaAs.

26. A method as in claim 1, wherein the impurity gas is one of dimethyl-cadmium (DMCd), Si$_2$H$_6$, tri-methyl-gallium (TMG), di-ethyl-selenium (DESe), and H$_2$Se.

27. A method as in claim 1, wherein the impurity gas contains silicon serving as an n-type impurity and the step (c) is carried out after exhausting in each cycle waste second source gas which contains gallium.

28. A method as in claim 1, wherein the impurity gas contains carbon serving as a p type impurity and the step (c) is carried out after exhausting in each cycle waste first source gas which contains arsenic.

29. A method of forming a monocrystalline thin film of a compound semiconductor comprising the steps of forming on a crystalline substrate a mask pattern of a material different from that of said substrate, disposing said substrate formed with said mask pattern in a crystal growth vessel after rinsing and drying, then evacuating the interior of said crystal growth vessel to a predetermined vacuum, heating said substrate, introducing gaseous molecules containing those of one component element of a compound semiconductor into said crystal growth vessel under a predetermined pressure for a predetermined period of time, evacuating the interior of said crystal growth vessel again, introducing gaseous molecules containing those of another component element of said compound semiconductor or containing a gas reacting with the first component element of said semiconductor into said crystal growth vessel under a predetermined pressure for a predetermined period of time, evacuating the interior of said crystal growth vessel again, and repeating a sequence of the above steps to cause growth of single monolayer, whereby a monocrystalline thin film of said compound semiconductor having a desired thickness is selectively formed on said substrate with precision as precise as a single monolayer.

30. A method as in claim 29, wherein said crystalline substrate is made of a compound semiconductor of III and V group elements and said gaseous molecules as the sources of the growth include III and V group elements.

31. A method as in claim 29, wherein said substrate is irradiated with light having a wavelength of 180 to 600 nm.

32. A method as in claim 30, further comprising the steps of using a film of $Si_xN_y$ and/or a film of $Si_xO_y$ as the material of said mask pattern and using a liquid containing trialkyl 2, 1-hydroxyalkyl ammonium hydroxide (THAH) as rinsing liquid for rinsing said substrate prior to the growth and also as an etchant.

* * * * *

UNITED STATES PATENT AND TRADEMARK OFFICE
CERTIFICATE OF CORRECTION

PATENT NO.: 5,693,139
DATED : December 2, 1997
INVENTOR(S): Jun-ichi NISHIZAWA

It is certified that an error appears in the above-identified patent and that said Letters Patent is hereby corrected as shown below:

Column 18, line 9, (claim 16), "fill" should read --film--.

Column 19, line 43, (claim 20), "$Ga_{1-x}$" should read --$Ga_{(1-x)}$--.

Column 19, line 53, (claim 20), "$Ga_{(1-x}$" should read --$Ga_{(1-x)}$--.

Column 20, line 19, (claim 22), "Constituent" should read --constituent--.

Signed and Sealed this

Fourteenth Day of April, 1998

Attest:

BRUCE LEHMAN

Attesting Officer

Commissioner of Patents and Trademarks